(12) United States Patent
Shelnutt et al.

(10) Patent No.: US 10,146,231 B2
(45) Date of Patent: Dec. 4, 2018

(54) LIQUID FLOW CONTROL BASED UPON ENERGY BALANCE AND FAN SPEED FOR CONTROLLING EXHAUST AIR TEMPERATURE

(71) Applicant: DELL PRODUCTS, L.P., Round Rock, TX (US)

(72) Inventors: Austin Michael Shelnutt, Leander, TX (US); Travis C. North, Cedar Park, TX (US); Christopher M. Helberg, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 118 days.

(21) Appl. No.: 15/017,451

(22) Filed: Feb. 5, 2016

(65) Prior Publication Data

US 2017/0181326 A1 Jun. 22, 2017

Related U.S. Application Data

(60) Provisional application No. 62/270,584, filed on Dec. 22, 2015, provisional application No. 62/270,574, (Continued)

(51) Int. Cl.
*G05D 7/00* (2006.01)
*G05D 7/06* (2006.01)
(Continued)

(52) U.S. Cl.
CPC ........... *G05D 7/0629* (2013.01); *G05B 15/02* (2013.01); *H05K 7/20736* (2013.01);
(Continued)

(58) Field of Classification Search
CPC .................................................. G05D 7/0635
(Continued)

(56) References Cited

U.S. PATENT DOCUMENTS 5,758,607 A * 6/1998 Brendel ................. F01P 7/167
123/41.1
6,462,949 B1 10/2002 Parish et al.
(Continued)

OTHER PUBLICATIONS

Dravininkas, Adam B., Restriction Requirement, U.S. Appl. No. 15/049,074, The United States Patent and Trademark Office, dated Jul. 13, 2017.
(Continued)

*Primary Examiner* — Suresh Suryawanshi
(74) *Attorney, Agent, or Firm* — Isidore PLLC

(57) ABSTRACT

A computer-implemented method regulates exhaust air temperature from direct interface liquid-cooled (DL) nodes in a rack information handling system (RIHS). The method includes receiving a first input corresponding to a desired ambient temperature of an exterior space and a second input is corresponding to an amount of heat being dissipated from functional components operating within an interior space of at least one LC node. An ambient temperature reading of the exterior space is received. A flow rate is calculated for liquid flowing through an air-to-liquid heat exchange (ATLHE) subsystem that results in an amount of heat exchange in the ATLHE subsystem, which generates exhaust air at a temperature that causes a change in the ambient temperature towards the desired ambient temperature. The flow rate is dynamically adjusted of the liquid flowing through the ATLHE subsystem to the calculated flow rate.

20 Claims, 16 Drawing Sheets

Related U.S. Application Data filed on Dec. 21, 2015, provisional application No. 62/270,563, filed on Dec. 21, 2015.

(51) Int. Cl.
    *G05B 15/02*     (2006.01)
    *H05K 7/20*     (2006.01)

(52) U.S. Cl.
    CPC ..... *H05K 7/20772* (2013.01); *H05K 7/20781* (2013.01); *H05K 7/20836* (2013.01)

(58) Field of Classification Search
    USPC ......................................................... 700/282
    See application file for complete search history.

(56) References Cited

U.S. PATENT DOCUMENTS

| | | |
|---|---|---|
| 6,574,104 B2 | 6/2003 | Patel et al. |
| 6,775,137 B2 | 8/2004 | Chu et al. |
| 7,013,955 B2 | 3/2006 | Phillips et al. |
| 7,106,590 B2 | 9/2006 | Chu et al. |
| 7,403,384 B2 | 7/2008 | Pflueger |
| 7,657,347 B2 | 2/2010 | Campbell et al. |
| 7,944,694 B2 | 5/2011 | Campbell et al. |
| 7,963,119 B2* | 6/2011 | Campbell ................ G06F 1/20 165/104.33 |
| 7,990,709 B2 | 8/2011 | Campbell et al. |
| 8,387,249 B2 | 3/2013 | Campbell et al. |
| 8,405,975 B2 | 3/2013 | Helberg et al. |
| 8,422,218 B2 | 4/2013 | Fried et al. |
| 8,516,284 B2 | 8/2013 | Chan et al. |
| 8,564,951 B1 | 10/2013 | Watanabe et al. |
| 8,583,290 B2* | 11/2013 | Campbell .......... G05D 23/1934 700/282 |
| 8,749,968 B1 | 6/2014 | Branton |
| 8,797,740 B2 | 8/2014 | Campbell et al. |
| 8,824,143 B2 | 9/2014 | Campbell et al. |
| 8,842,433 B2* | 9/2014 | Koblenz ............ G05D 23/1917 361/679.47 |
| 8,934,244 B2 | 1/2015 | Shelnutt et al. |
| 8,978,401 B2* | 3/2015 | Chainer ............ H05K 7/20836 62/201 |
| 9,045,995 B2 | 6/2015 | Graybill et al. |
| 9,069,532 B2 | 6/2015 | Campbell et al. |
| 9,250,636 B2* | 2/2016 | Chainer ................ G06F 1/206 |
| 9,386,727 B2* | 7/2016 | Barringer .......... H05K 7/20736 |
| 9,451,726 B2 | 9/2016 | Regimbal et al. |
| 9,496,200 B2 | 11/2016 | Lyon et al. |
| 10,010,013 B2 | 6/2018 | Shelnutt et al. |
| 2004/0190247 A1 | 9/2004 | Chu et al. |
| 2004/0221604 A1 | 11/2004 | Ota et al. |
| 2005/0122685 A1 | 6/2005 | Chu et al. |
| 2005/0248922 A1 | 11/2005 | Chu et al. |
| 2008/0067805 A1 | 3/2008 | Kamada et al. |
| 2008/0232064 A1 | 9/2008 | Sato et al. |
| 2008/0276639 A1 | 11/2008 | Stoddard |
| 2009/0086428 A1 | 4/2009 | Campbell et al. |
| 2009/0086432 A1 | 4/2009 | Campbell et al. |
| 2009/0126909 A1 | 5/2009 | Ellsworth et al. |
| 2009/0126910 A1 | 5/2009 | Campbell et al. |
| 2009/0154096 A1 | 6/2009 | Iyengar et al. |
| 2009/0165868 A1 | 7/2009 | Pearson |
| 2009/0259343 A1 | 10/2009 | Rasmussen et al. |
| 2009/0262501 A1 | 10/2009 | Claassen et al. |
| 2010/0032142 A1* | 2/2010 | Copeland .......... G05D 23/1925 165/104.33 |
| 2010/0103614 A1 | 4/2010 | Campbell et al. |
| 2010/0103618 A1 | 4/2010 | Campbell et al. |
| 2011/0060470 A1 | 3/2011 | Campbell et al. |
| 2011/0075373 A1 | 3/2011 | Campbell et al. |
| 2011/0083621 A1* | 4/2011 | Ogunleye ............... F01N 3/208 123/41.02 |
| 2011/0112694 A1 | 5/2011 | Bash et al. |
| 2011/0313576 A1 | 12/2011 | Nicewonger |
| 2012/0180979 A1 | 7/2012 | Harrington |
| 2013/0098085 A1 | 4/2013 | Judge et al. |
| 2013/0106265 A1 | 5/2013 | Shelnutt et al. |
| 2013/0112378 A1 | 5/2013 | Shelnutt et al. |
| 2013/0128455 A1 | 5/2013 | Koblenz et al. |
| 2013/0229769 A1 | 9/2013 | Yang |
| 2013/0264046 A1* | 10/2013 | Chainer ................ G06F 1/206 165/287 |
| 2013/0312839 A1 | 11/2013 | Shelnutt et al. |
| 2013/0312846 A1 | 11/2013 | Eriksen et al. |
| 2013/0312854 A1 | 11/2013 | Eriksen et al. |
| 2014/0202678 A1 | 7/2014 | Goth et al. |
| 2014/0203550 A1 | 7/2014 | Utsch |
| 2014/0218859 A1 | 8/2014 | Shelnutt et al. |
| 2014/0321056 A1 | 10/2014 | Yoshikawa et al. |
| 2014/0328562 A1 | 11/2014 | Pitwon |
| 2015/0109735 A1 | 4/2015 | Campbell et al. |
| 2015/0233597 A1 | 8/2015 | Dempster et al. |
| 2015/0334878 A1 | 11/2015 | Long et al. |
| 2016/0066480 A1 | 3/2016 | Eckberg et al. |
| 2016/0242319 A1 | 8/2016 | Edwards et al. |
| 2016/0242326 A1 | 8/2016 | Edwards et al. |
| 2016/0366792 A1 | 12/2016 | Smith et al. |
| 2017/0049009 A1 | 2/2017 | Steinke et al. |
| 2017/0181322 A1 | 6/2017 | Shelnutt et al. |
| 2017/0181323 A1 | 6/2017 | Shelnutt et al. |

OTHER PUBLICATIONS

Ahmad, Yahya A., Non-Final Office Action, U.S. Appl. No. 15/016,226, The United States Patent and Trademark Office, dated Apr. 7, 2017.
Brown, Robert D., Notice of Allowance, U.S. Appl. No. 15/017,582, The United States Patent and Trademark Office, dated Jun. 13, 2017.
Dravininkas, Adam B., Non-Final Office Action, U.S. Appl. No. 15/016,249, The United States Patent and Trademark Office, dated Jun. 20, 2017.
Brown, Michael J., Non-Final Office Action, U.S. Patent Application No. 15/016,234, The United States Patent and Trademark Office, dated Mar. 30, 2018.
Dravininkas, Adam B., Notice of Allowance, U.S. Patent Application No. 15/016,249, The United States Patent and Trademark Office, dated Feb. 26, 2018.
Dravininkas, Adam, Ex Parte Quayle Action, U.S. Appl. No. 15/016,249, The United States Patent and Trademark Office, Oct. 24, 2017.
Dravininkas, Adam, Non-Final Office Action, U.S. Appl. No. 15/049,074, The United States Patent and Trademark Office, dated Nov. 14, 2017.
Suryawanshi, Suresh, Non-Final Office Action, U.S. Appl. No. 15/017,604, The United States Patent and Trademark Office, dated Dec. 22, 2017.
Suryawanshi, Suresh, Non-Final Office Action, U.S. Appl. No. 15/017,492, The United States Patent and Trademark Office, dated Nov. 3, 2017.
Brown, Robert D., Non-Final Office Action, U.S. Appl. No. 15/698,642, The United States Patent and Trademark Office, dated May 24, 2018.
Dravinikas, Adam, Final Office Action, U.S. Appl. No. 15/049,074, The United States Patent and Trademark Office, dated Apr. 27, 2018.
Patent Cooperation Treaty (PCT), International Preliminary Report on Patentability, International Application No. PCT/US2016/031379, dated Jun. 26, 2018.
Suryawanshi, Suresh, Notice of Allowance, U.S. Appl. No. 15/017,604, The United States Patent and Trademark Office, dated Jun. 6, 2018.
Suryawanshi, Suresh, Notice of Allowance, U.S. Appl. No. 15/017,492, The United States Patent and Trademark Office, dated May 2, 2018.

\* cited by examiner

LIQUID FLOW CONTROL BASED UPON ENERGY BALANCE AND FAN SPEED FOR CONTROLLING EXHAUST AIR TEMPERATURE

PRIORITY

The present invention claims priority from each of the following provisional patent applications, with relevant content of each listed provisional application incorporated herein by reference: Provisional Application Ser. No.: 62/270,563, with filing date Dec. 21, 2015; Provisional Application Ser. No. 62/270,584, with filing date Dec. 22, 2015; and Provisional Application Ser. No. 62/270,574, with filing date Dec. 21, 2015.

BACKGROUND

1. Technical Field

The present disclosure generally relates to information handling systems (IHS), and more particular to a direct-injection liquid cooled (DL) rack-configured IHS (RIHS). Still more particularly, the disclosure is related to modulating exhaust air temperature using liquid flow control within the RIHS.

2. Description of the Related Art

As the value and use of information continue to increase, individuals and businesses seek additional ways to process and store information. One option available to users is Information Handling Systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The RIHS includes a physical rack, within which is inserted a plurality of functional nodes, such as server (or processing) nodes/modules, storage nodes, and power supply nodes. These nodes, and particularly the server nodes, typically include processors and other functional components that dissipate heat when operating and/or when connected to a power supply. Efficient removal of the heat being generated by these components is required to maintain the operational integrity of the RIHS. Traditional heat removal systems include use of air movers, such as fans, to transfer the heat via convection from inside of the RIHS to outside the RIHS. More recently, some RIHS have been designed to enable submersion of the server modules and/or the heat generating components in a tank of cooling liquid to effect cooling via absorption of the heat by the surrounding immersion liquid.

The amount of processing capacity and storage capacity per node and/or per rack continues to increase, resulting in greater heat dissipation per node and requiring more directed cooling solutions. Thus, there is a continuing need for further innovations to provide directed cooling for the individual heat generating components, both at the individual node level, as well as at the larger rack level. When designing the cooling subsystem, consideration must also be given to the different form factors of IT nodes and rack heights of the RIHS, and the ability to effectively control cooling discretely (at device or node level) and generally across the overall RIHS and ambient space.

BRIEF SUMMARY

The illustrative embodiments of the present disclosure provide a direct-injection liquid cooled (DL) rack information handling system (RIHS), a liquid cooling system, and a computer-implemented method that regulates exhaust air temperature using cooling liquid flow control.

According to one embodiment, a computer-implemented method is disclosed. The method comprises receiving a first input corresponding to a desired ambient temperature of an exterior space surrounding a direct-injection, liquid-cooled (DL) rack information handling system (RIHS). The RIHS comprises at least one liquid cooled (LC) node within a block chassis and a corresponding air-to-liquid heat exchange (ATLHE) subsystem through which air passing thought the LC node is channeled as exhaust air towards the exterior space. A second input is received corresponding to an amount of heat being dissipated from functional components operating within an interior space of the at least one LC node. An ambient temperature reading of the exterior space is received. A flow rate is calculated for liquid flowing through the ATLHE subsystem that results in an amount of heat exchange in the ATLHE subsystem, which generates exhaust air at a temperature that causes a change in the ambient temperature towards the desired ambient temperature. The flow rate is dynamically adjusted of the liquid flowing through the ATLHE subsystem to the calculated flow rate.

Also disclosed is a liquid cooling system for a DL RIHS. The liquid cooling subsystem comprises a rack having at least one liquid cooled (LC) node within a block chassis; and a liquid cooling subsystem associated with the rack. The liquid cooling subsystem includes at least one air-to-liquid heat exchange ATLHE subsystem that receives intake air at a first temperature and provides exhaust air at a second temperature based on a heat exchange gradient between cooling liquid flowing through the ATLHE subsystem and the ambient temperature of air being passed through the ATLHE subsystem. A network of conduits that enables cooling liquid to flow through the at least one LC node and through the ATLHE subsystem. The network of conduits includes an intake conduit that enables cooling fluid to be passed through the at least one LC node. At least one liquid control valve is in fluid communication with, and controlling a rate of flow of cooling liquid through, corresponding fluid intake ports of the network of conduits. A controller is associated with the at least one LC node and is communicatively coupled to the at least one liquid control valves and to at least one temperature measuring device. The controller has firmware executing thereon that configures the controller to receive a first input corresponding to a desired ambient temperature of an exterior space surrounding the DL RIHS and to receive a second input corresponding to an amount of heat being dissipated from functional components operating within an interior space of the at least one LC node. An ambient temperature reading of the exterior space is received. The controller calculates a flow rate for liquid flowing through the ATLHE subsystem that results in an amount of heat exchange in the ATLHE subsystem, which generates exhaust air at a temperature that causes a change in the ambient temperature towards the desired ambient temperature. The flow rate is dynamically adjusting of the liquid flowing through the ATLHE subsystem to the calculated flow rate.

According to another embodiment, a DL RIHS is disclosed. The DL RIHS includes a rack having at least one LC node and the above-described liquid cooling subsystem associated with the rack.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
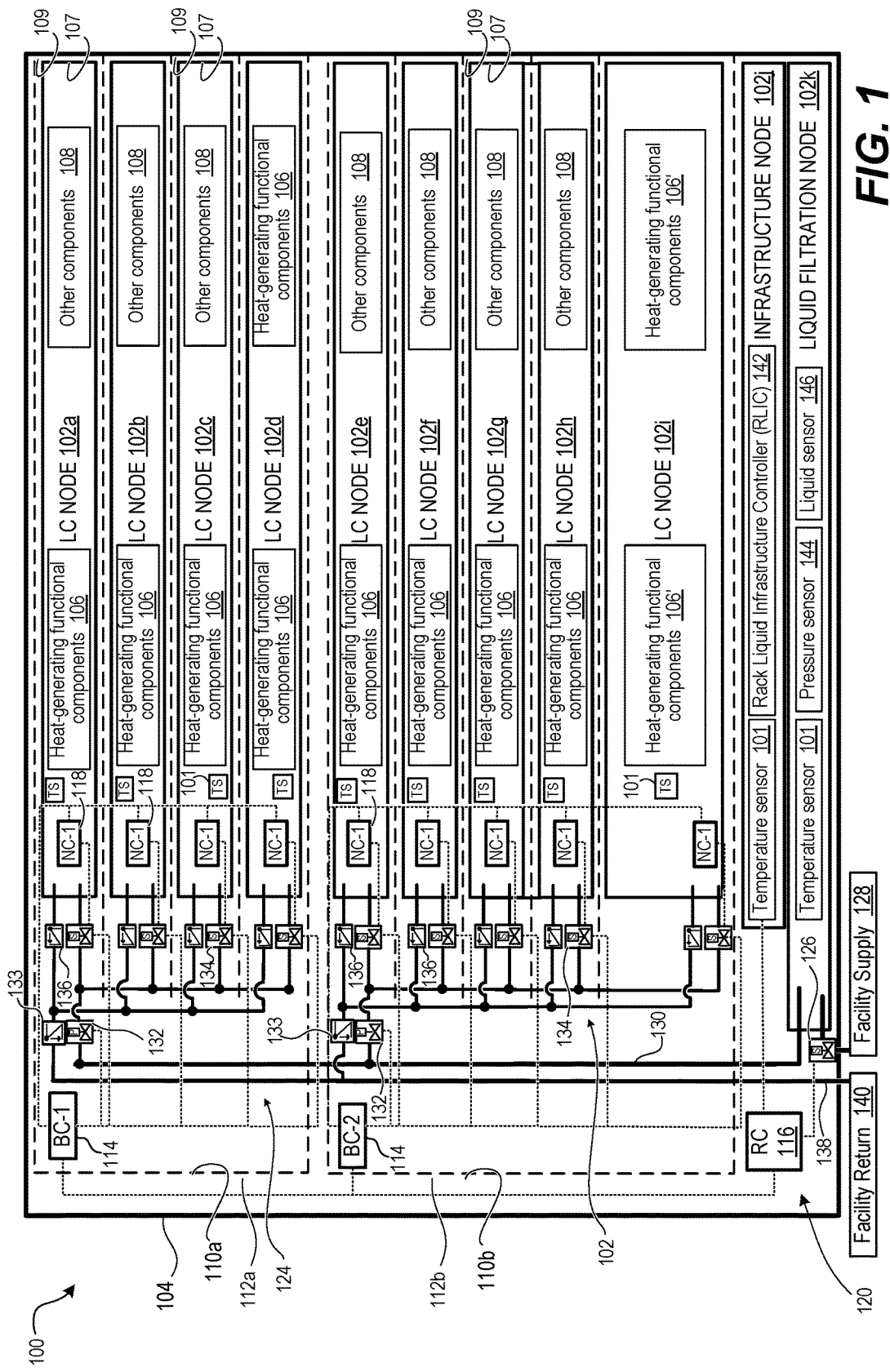
FIG. 1 illustrates a side perspective view of an internal layout/configuration of an example Direct-Interface Liquid-Cooled (DL) RIHS, according to one or more embodiments.

The present disclosure generally provides a Direct-Interface Liquid-Cooled (DL) Rack Information Handling System (RIHS) providing liquid cooled (LC) information technology (IT) nodes containing heat-generating functional components and which are cooled at least in part by a liquid cooling subsystem. The RIHS includes a rack configured with chassis-receiving bays in which is received a respective chassis of one of the LC nodes. Each LC node is configured with a system of conduits to receive direct injection of cooling liquid to regulate the ambient temperature of the node. Additionally, each LC node, configured with a system of conduits, provides cooling to the components inside the node by conductively absorbing, via the cooling liquid, heat generated by the heat-generating functional components. The absorbed heat is removed (or transferred away) from within the node to outside of the node and/or the RIHS.

The present disclosure also provides a computer-implemented method for regulating exhaust air temperature from a DL RIHS. The method includes receiving a first input corresponding to a desired ambient temperature of an exterior space surrounding a DL RIHS. The RIHS comprises at least one liquid cooled (LC) node within a block chassis and a corresponding air-to-liquid heat exchange (ATLHE) subsystem through which air passing thought the LC node is channeled as exhaust air towards the exterior space. A second input is received corresponding to an amount of heat being dissipated from functional components operating within an interior space of the at least one LC node. An ambient temperature reading of the exterior space is received. A flow rate is calculated for liquid flowing through the ATLHE subsystem that results in an amount of heat exchange in the ATLHE subsystem, which generates exhaust air at a temperature that causes a change in the ambient temperature towards the desired ambient temperature. The flow rate is dynamically adjusted of the liquid flowing through the ATLHE subsystem to the calculated flow rate.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As utilized herein, the term "rack-configured" (as in RIHS) generally refers to the configuration of a large scale sever system within a physical rack having multiple chassis receiving rails for receiving specific sizes of information technology (IT) nodes, such as server modules, storage modules, and power modules. The term node generally refers to each separate unit inserted into a 1 U or other height rack space within the rack. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

For purposes of this disclosure, an information handling system (defined at the individual server level) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

As illustrated by the figures and described herein, multiple processing servers or server IHSs (referred to herein as server nodes) can be included within the single RIHS. Certain aspect of the disclosure then relate to the specific LC (sever or other) nodes and the functionality associated with these individual nodes or block-level groupings of nodes, while other aspects more generally relate to the overall DL RIHS containing all of the LC nodes.

As one design detail/aspect for the present innovation, consideration is given to the fact that extreme variations can exist in server/power/network topology configurations within an IT rack. In addition to dimension variations, the thermal requirements for heat-generating functional components for power, control, storage and server nodes can be very different between types or vary according to usage. These variations drive corresponding extreme diversity in port placement, fitting size requirements, mounting locations, and manifold capacity for a liquid cooling subsystem. Further, a chassis of each node is typically densely provisioned. Lack of space thus exists to mount a discrete water distribution manifold in high-power IT racks. The present disclosure addresses and overcomes the challenges with distributing liquid cooling fluids throughout an IT rack having nodes with a large number of variations in distribution components.

The disclosure also includes the additional consideration that in addition to cooling the primary heat generating components of the rack, such as the processor, what is needed is a way to allow for cooling of secondary equipment within the rack, as well as auxiliary components that would further support utilizing the advantages of a fluid-to-fluid heat exchanger methodology. Additionally, the present disclosure provides a modular approach to utilizing an air-to-liquid heat exchanger with quick connection and scalability to allow the solution to be scalable in both 1 U and 2 U increments.

FIG. 1 illustrates a side perspective view of an internal layout/configuration of an example Direct-Interface Liquid-Cooled (DL) RIHS 100 configured with a plurality of LC nodes 102, according to one or more embodiments. For simplicity, the example DL RIHS presented in the various illustrations can be described herein as simply RIHS 100; however, references to RIHS 100 are understood to refer to a DL RIHS, with the associated liquid cooling infrastructure and/or subsystems and supported LC nodes 102. RIHS 100 includes rack 104, which comprises a rack frame and side panels, creating a front-to-back cabinet within which a plurality of chassis receiving bays are vertically arranged and in which a chassis of a respective IT node 102 can be inserted. Rack 104 includes certain physical support structures (not specifically shown) that support IT gear insertion at each node location. Additional description of the structural make-up of an example rack is provided in the description of FIGS. 2-4, which follows.

FIG. 1 further depicts an illustrative example of LC nodes 102a-102j (collectively refer to as nodes 102), with each nodes 102a-102i including heat-generating functional components 106. Additionally, RIHS 100 also includes an infrastructure node 102j and liquid filtration node 102k, which do not necessarily include heat-generating functional components 106 that require liquid cooling, as the other LC nodes 102a-102i. In the illustrative embodiments, nodes 102a-102b, and 102e-102h include other components 108 that are not necessarily heat generating, but which are exposed to the same ambient heat conditions as the heat generating components by virtue of their location within the node. In one embodiment, these other components 108 can be sufficiently cooled by the direct injection of cooling liquid applied to the node and/or using forced or convective air movement, as described later herein. Each node 102 is supported and protected by a respective node enclosure 107. Nodes 102a-102d are further received in node receiving bays 109 of a first block chassis 110a of a first block 112a. Nodes 102e-102i are received in a second block chassis 110 of a second block 112b. In the illustrative embodiments, the nodes 102 are vertically arranged. In one or more alternate embodiments, at least portions of the nodes 102 (and potentially all of the nodes) may also be arranged horizontally while benefiting from aspects of the present innovation.

The present innovation is not limited to any specific number or configuration of nodes 102 or blocks 112 in a rack 104. According to one aspect, nodes 102 can be of different physical heights of form factors (e.g., 1 U, 1.5 U, 2 U), and the described features can also be applied to nodes 102 having different widths and depths (into the rack), with some extensions made and/or lateral modifications to the placement of cooling subsystem conduits, as needed to accommodate the different physical dimensions. As a specific example, node 102l is depicted as having a larger node enclosure 107' (with corresponding different dimensions of heat-generating functional components 106') of a different number of rack units in physical height (e.g., 2 U) that differs from the heights (e.g., 1 U) of the other nodes 102a-102h and 102j-102k. RIHS 100 can include blocks 112 or nodes 102 selectably of a range of discrete rack units. Also, different types of IT components can be provided within each node 102, with each node possibly performing different functions within RIHS 100. Thus, for example, a given node 102 may include one of a server module, a power module, a control module, or a storage module. In a simplest configuration, the nodes 102 can be individual nodes operating independent of each other, with the RIHS 100 including at least one rack-level controller (RC) 116 for controlling operational conditions within the RIHS 100, such as temperature, power consumption, communication, and the like. Each node 102 is then equipped with a node-level controller (NC) 118 that communicates with the rack-level controller 116 to provide localized control of the operational conditions of the node 102. In the more standard configuration of a DL RIHS 100, and in line with the described embodiments, RIHS 100 also includes block-level controllers (BCs) 114, communicatively coupled to the rack-level controller 116 and performing block-level control functions for the LC nodes within the specific block. In this configuration, the nodes 102 are arranged into blocks 112, with each block 112 having one or more nodes 102 and a corresponding block-level controller 114. Note the blocks do not necessarily include the same number of nodes, and a block can include a single node, in some implementations.

A Direct-Interface Liquid Cooling (DL) subsystem (generally shown as being within the RIHS and labelled herein as 120) provides liquid cooling to heat-generating functional components 106 via a liquid rail 124 under the control of the rack-level controller 116, block-level controllers 114, and/or node-level controllers 118, in some embodiments. Rack-level controller 116 controls a supply valve 126, such as a solenoid valve, to allow cooling liquid, such as water, to be received from a facility supply 128. The cooling liquid is received from facility supply 128 and is passed through liquid filtration node 102l before being passed through supply conduit 130 of liquid rail 124. Each block 112a, 112b receives a dynamically controlled amount of the cooling liquid via block-level dynamic control valve 132, such as a proportional valve. Return flow from each block 112a, 112b can be protected from backflow by a block check valve 133. The individual needs of the respective nodes 102a-102d of block 112a can be dynamically provided by respective node-level dynamic control valves 134, controlled by the block-level controller 114, which control can, in some embodiments, be facilitated by the node-level controllers 118. In addition to allocating cooling liquid in accordance with cooling requirements (which can be optimized for considerations such as performance and economy), each of the supply valve 126 and/or dynamic control valves 132, 134 can be individually closed to mitigate a leak. A check valve 136 is provided between each node 102a-102j and a return conduit 138 of the liquid rail 124 to prevent a backflow into the nodes 102a-102j. The return conduit 138 returns the cooling liquid to a facility return 140.

To support the temperature control aspects of the overall system, RIHS 100 includes temperature sensors 101 that are each located within or proximate to each node 102a-102j, with each gauge 101 connected to the node-level controller 118 and/or the corresponding block-level controller 114. Temperature sensors 101 operate in a feedback control loop of the liquid cooling system 122 to control the amount of liquid flow required to cool the nodes 102a-102j. In one or more embodiments, the rack-level controller 116 can coordinate performance constraints to block-level controllers 114 and/or node-level controllers 118 that limit an amount of heat generated by the heat-generating functional components 106 to match a heat capacity of the flow of cooling liquid in DL subsystem 122. Alternatively or in addition, the rack-level controller 116 can coordinate cooling levels to block-level controllers 114 and/or node-level controllers 118 that in turn control the dynamic control valves 132, 134 for absorption and transfer of the heat generated by the heat-generating functional components 106 by the DL subsystem 122. In one or more embodiments, support controllers such as a Rack Liquid Infrastructure Controller (RLIC) 142 can perform management and operational testing of DL subsystem 122. RLIC 142 can monitor pressure sensors 144 and liquid sensors 146 to detect a leak, to validate operation of namic control valves 132, 134 or shut-off valves such as supply valve 126. RLIC 142 can perform close-loop control of specific flow rates within the RIHS 100.

Figure 2:
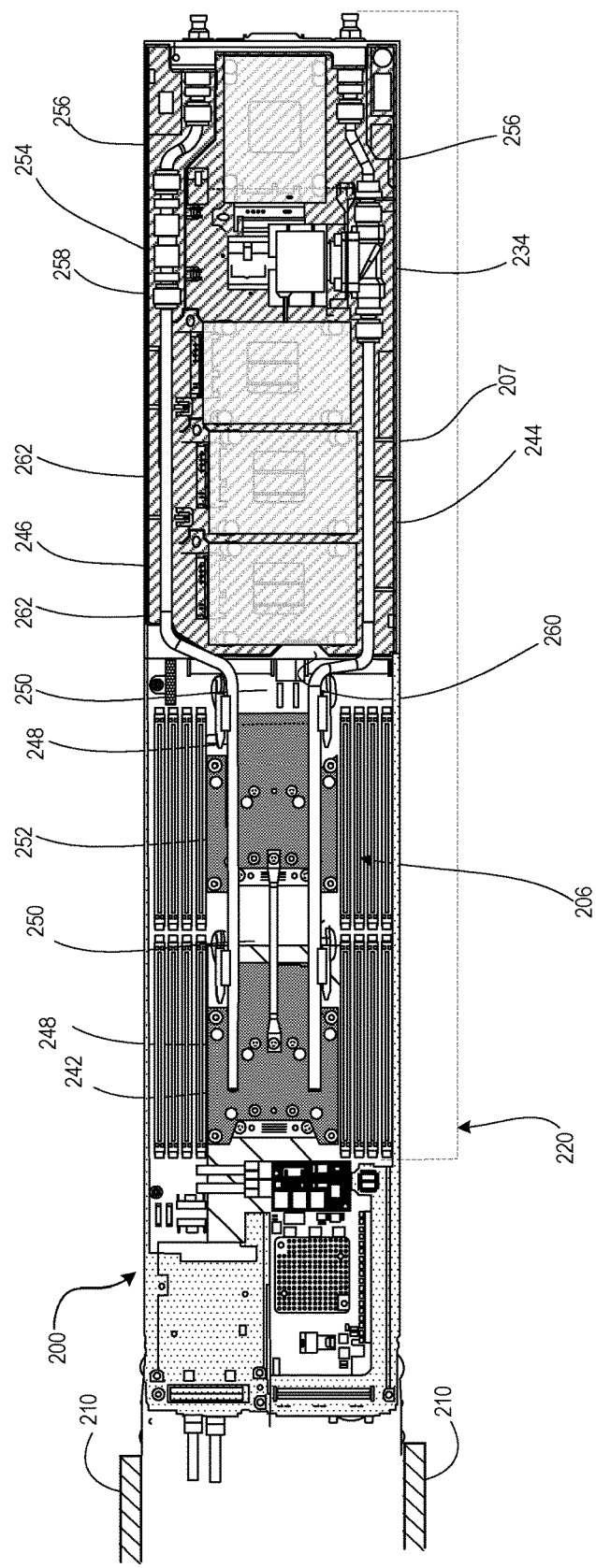
FIG. 2 illustrates a top view of an example LC node configured with a liquid cooling subsystem that includes a liquid-to-liquid manifold and cooling pipes for conductively cooling internal functional components, according to one or more embodiments.

FIG. 2 illustrates example LC node 200 of example DL RIHS 100 of FIG. 1 having a node enclosure 208 insertable into a block chassis 210. For purposes of description, node 200 is a server IHS that includes processing components or central processing units (CPUs), storage devices, and other components. LC node 200 includes cooling subsystem (generally shown and represented as 220) that includes a liquid-to-liquid manifold 242 to cool heat-generating functional components 206 by heat transfer from liquid provided by node-level supply conduit 244, and return conduit 246, according to one or more embodiments. Node-level supply conduit 244 and return conduit 246 are appropriately sized and architecturally placed relative to the other components and the dimensionality (i.e., width, height, and depth/length) of LC node 200 to permit sufficient cooling liquid to pass through the interior of LC the node 200 to remove the required amount of heat from LC node 200 in order to provide appropriate operating conditions (in terms of temperature) for the functional components located within LC node 200. Liquid-to-liquid manifold 242 can include CPU cold plates 248 and voltage regulator cold plates 250. A sled assembly grab handle 252 can be attached between CPU cold plates 248 for lifting LC node 200 out of block chassis 210. A return-side check valve 254 of the return conduit 246 can prevent facility water from back-feeding into LC node 200 such as during a leak event. Flex hose links 256 in each of node-level supply conduit 244 and return conduits 246 can reduce insertion force for sleds into block chassis 210. Sled emergency shutoff device 234 interposed in the supply conduit 244 can be a solenoid valve that closes in response to input from a hardware circuit during a sled-level leak detection event. Node-level carrier 258 received in node enclosure 208 can incorporate liquid containment structure 260 to protect storage device 262. In the illustrative example illustrated by FIG. 2, LC node 200 is oriented horizontally and is viewed from above. In one or more embodiments node-level carrier 258 is configured to route leaked cooling liquid away from storage device 262 when oriented vertically.

FIGS. 3-7 illustrate different exterior and rear views of an example assembled DL RIHS 300. DL RIHS 300 includes rack 304, which is a physical support structure having an exterior frame and attached side panels to create cabinet enclosure 364 providing interior chassis receiving bays (not shown) within which a plurality of individual node chasses (or sleds) 208 of functional IT nodes, such as LC node 200 of FIG. 2, are received. In the description of the figures, similar features introduced in an earlier figure are not necessarily described again in the description of the later figures.

Figure 4:
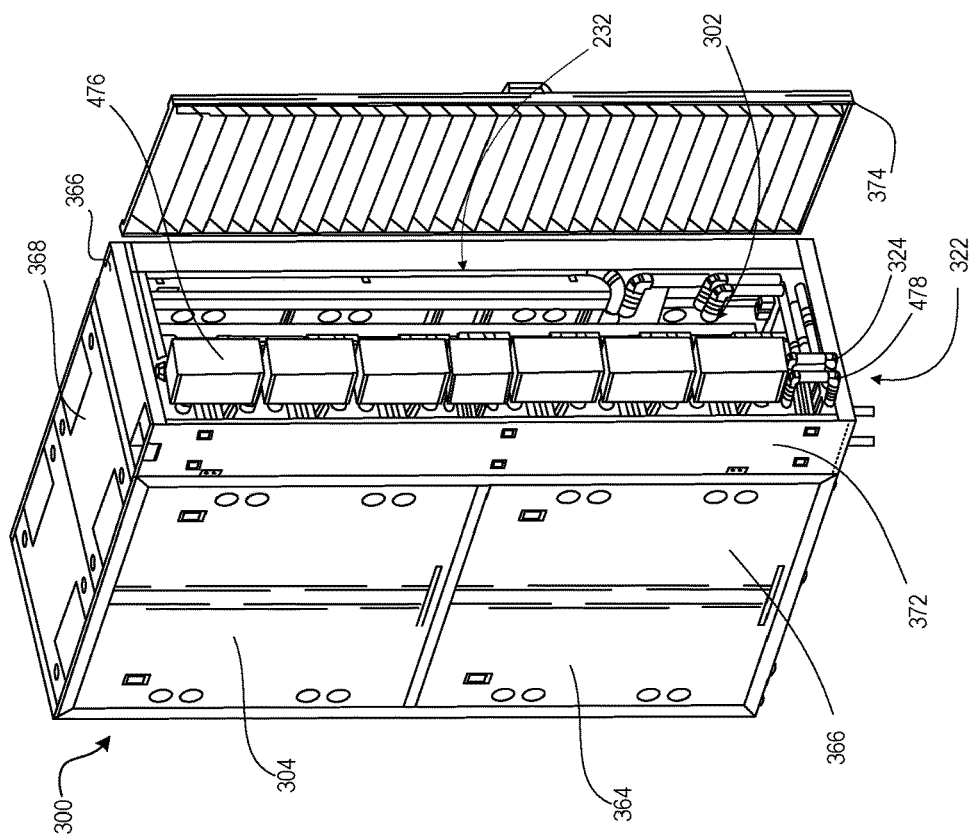
FIGS. 4 and 5 illustrate a rear perspective view of the example DL RIHS of FIG. 3 with the louvered rear door opened to expose node-to-node interconnection of MLD conduits of different vertical sizes having appropriately sized and removable pipe covers, according to one or more embodiments.
Figure 3:
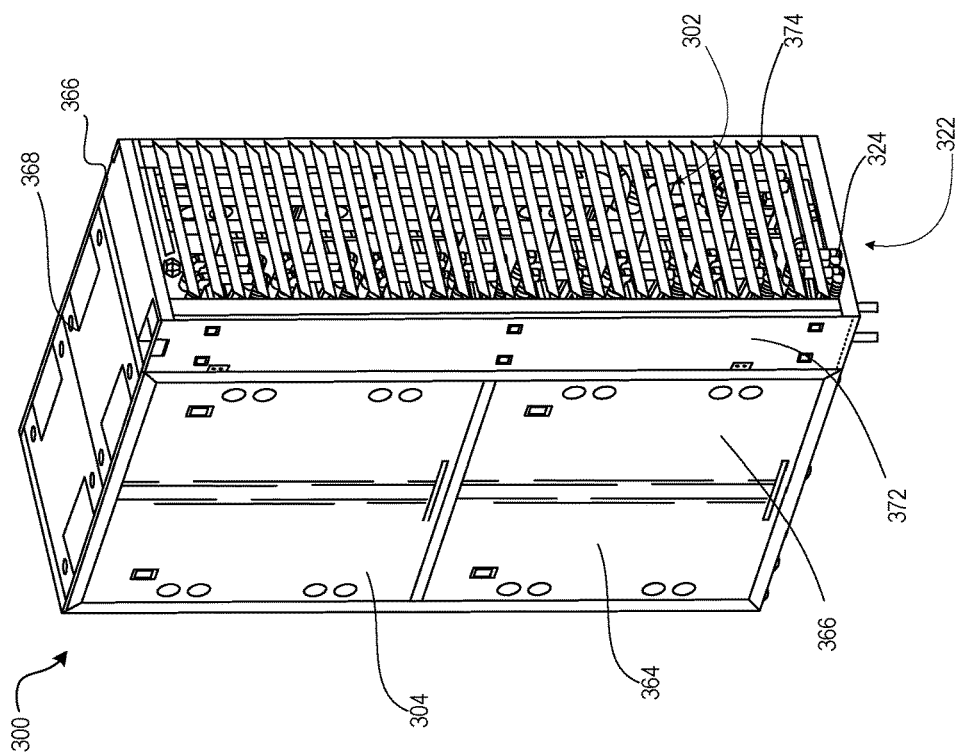
FIG. 3 illustrates a rear perspective view of an example DL RIHS with a louvered rear door in a closed position over uncovered MLD conduits, according to one or more embodiments.
Figure 5:
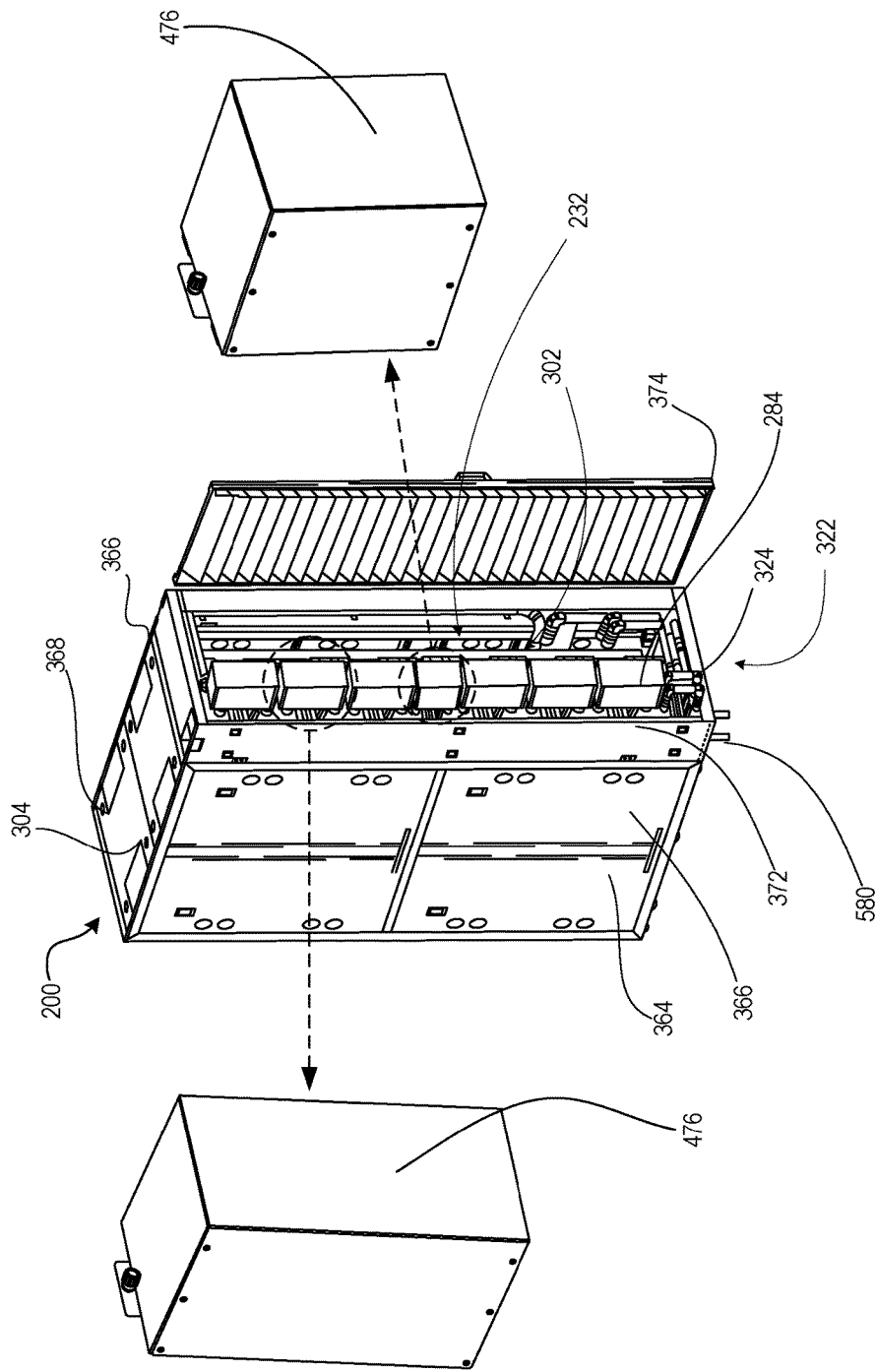

FIGS. 3-5 specifically illustrate exterior views of rack 304 of example DL RIHS 100. As illustrated, rack 304 includes opposing side panels 366, attached to a top panel 368 (and bottom panel—not shown) to create the main cabinet enclosure 364 that includes multiple chassis receiving bays for housing LC nodes 102/200. The created cabinet enclosure 364 includes a front access side (not shown) and a rear side. The front access side provides access to the chassis receiving bays created within the main cabinet enclosure 364 for receiving LC nodes 102 (of FIG. 1) into rack 304. Attached to the rear ends of the main opposing side panels 366 are opposing side panel extensions 372. A louvered rear door 374 is hinged (or otherwise attached) to one of the side panel extensions 372 and includes a latching mechanism for holding the door 374 in a closed position, where in a closed position is relative to the otherwise open space extending laterally between opposing side panel extensions 372. Side panel extensions 372 and louvered rear door 374 provide an extension to main cabinet enclosure 364 for housing, covering/protecting, and providing access to the modular, scalable liquid rail 324 of a liquid cooling subsystem 322 that provides liquid cooling to each LC node 102 (of FIG. 1) inserted into the chassis of the main cabinet enclosure 364.

FIG. 4 illustrates an embodiment in which rear pipe covers 476 can protect portions of liquid rail 324 (of FIG. 3), and specifically Modular Liquid Distribution (MLD) conduits 478, from inadvertent damage as well as containing any leaks from being directed at sensitive functional components 106 (of FIG. 1).

Illustrated in FIG. 5 are rear pipe covers 476 (of FIG. 4) of MLD conduits 478 (of FIG. 4) of liquid rail 324 (of FIG. 3) having different sizes. According to one aspect, the MLD conduits 478 (of FIG. 4) are rack unit dimensioned pipes that form a node-to-node scalable rack liquid manifold ("liquid rail") to distribute cooling liquid, as required, for each node 102 (of FIG. 1) and through the vertical arrangement of nodes 102 (of FIG. 1) within RIHS 100 (of FIG. 1). In an exemplary embodiment, the cooling liquid is received from a facility supply 128 (of FIG. 1) via below rack (e.g. ground level or below floor) connections 580.

Figure 6:
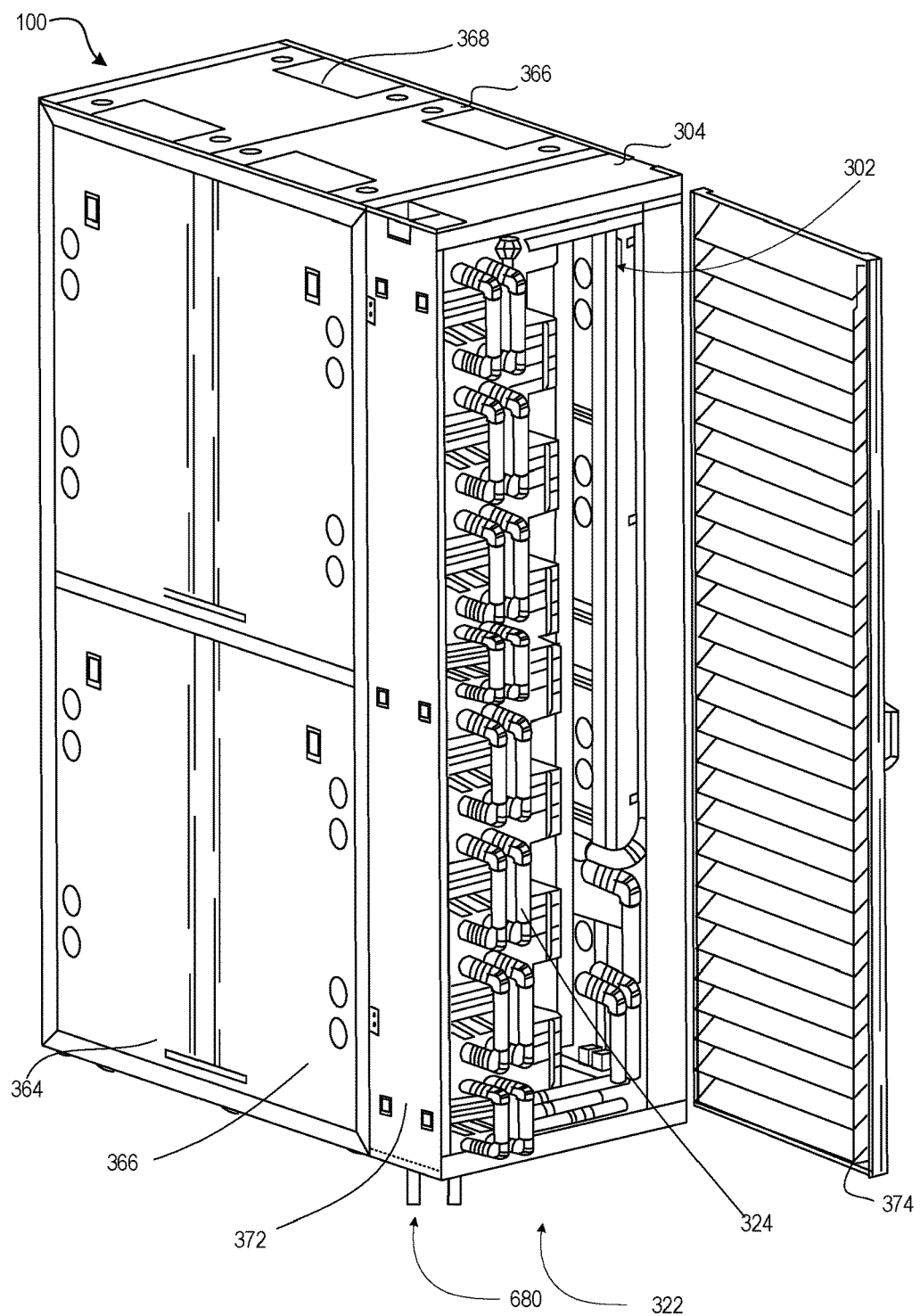
FIG. 6 illustrates the rear perspective view of FIGS. 4-5 with the pipe covers removed to expose the MLD conduits, according to one or more embodiments.

FIG. 6 illustrates an example RIHS 100, as depicted in FIG. 1, with MLD conduits 478 (of FIG. 4), that are uncovered, displaying liquid rail 324 (of FIG. 3). In the embodiment of FIG. 6, cooling liquid is received from a facility supply 128 (FIG. 1) by below rack (e.g. ground level or below floor) connections 680.

Figure 7:
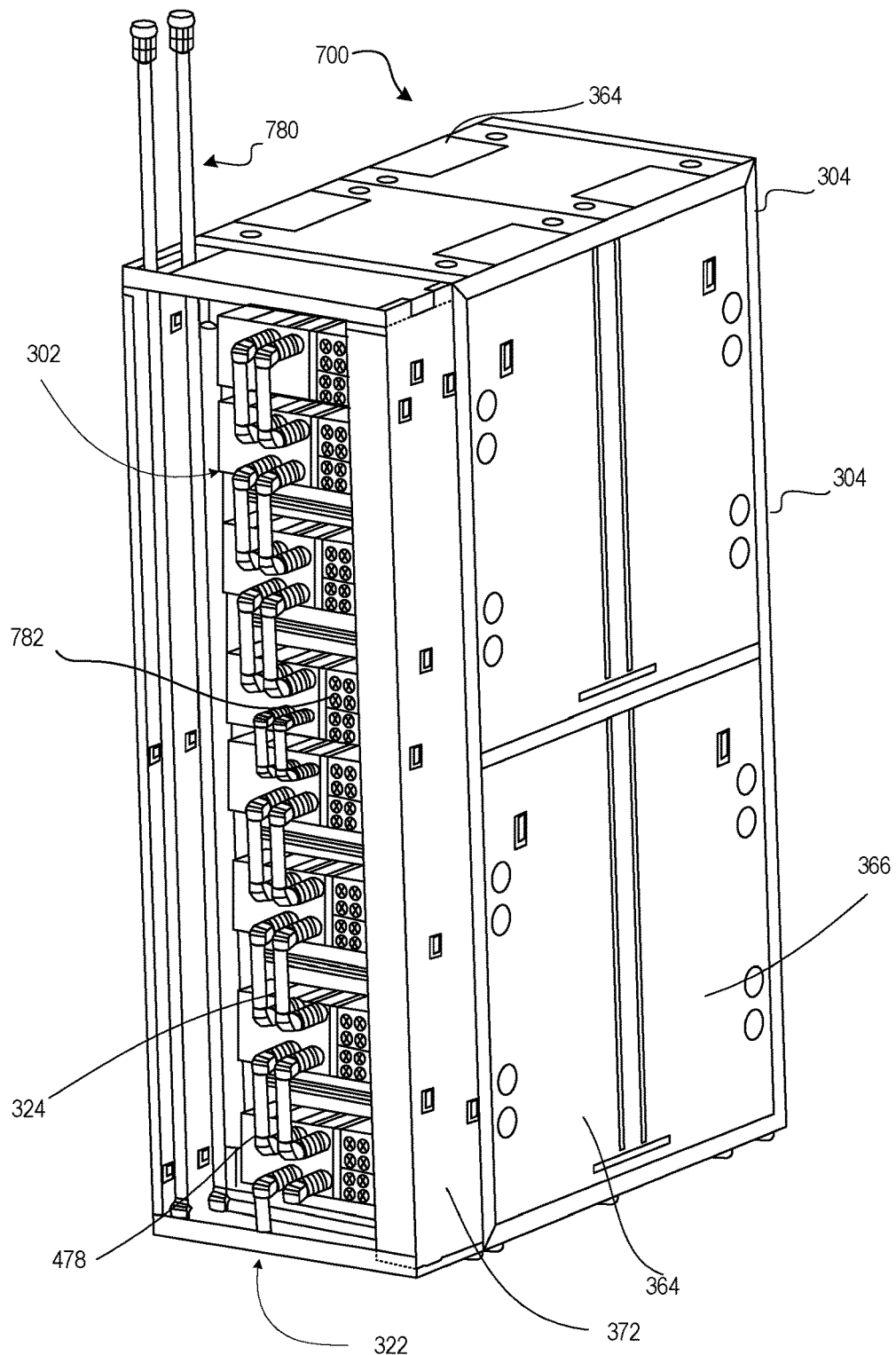
FIG. 7 illustrates a rear perspective view of an example RIHS with MLD conduits in fluid communication with supply side conduits extending from a top of the rack, according to one or more embodiments.

FIG. 7 illustrates a second example RIHS 700, wherein cooling liquid is received from facility supply 128 (FIG. 1) provided by an above-rack (and possibly in ceiling) connections 780. Also shown by FIG. 7 are air movers depicted as fan modules 782 adjacent to the liquid rail. These fan modules 782 are mounted at the back of RIHS 700 to draw air flow through LC nodes 102 providing additional cooling of LC nodes 102, of FIG. 1, (e.g., convection cooling for node components 106, of FIG. 1) that may or may not also receive direct-interface of cooling liquid, in different embodiments.

Figure 8:
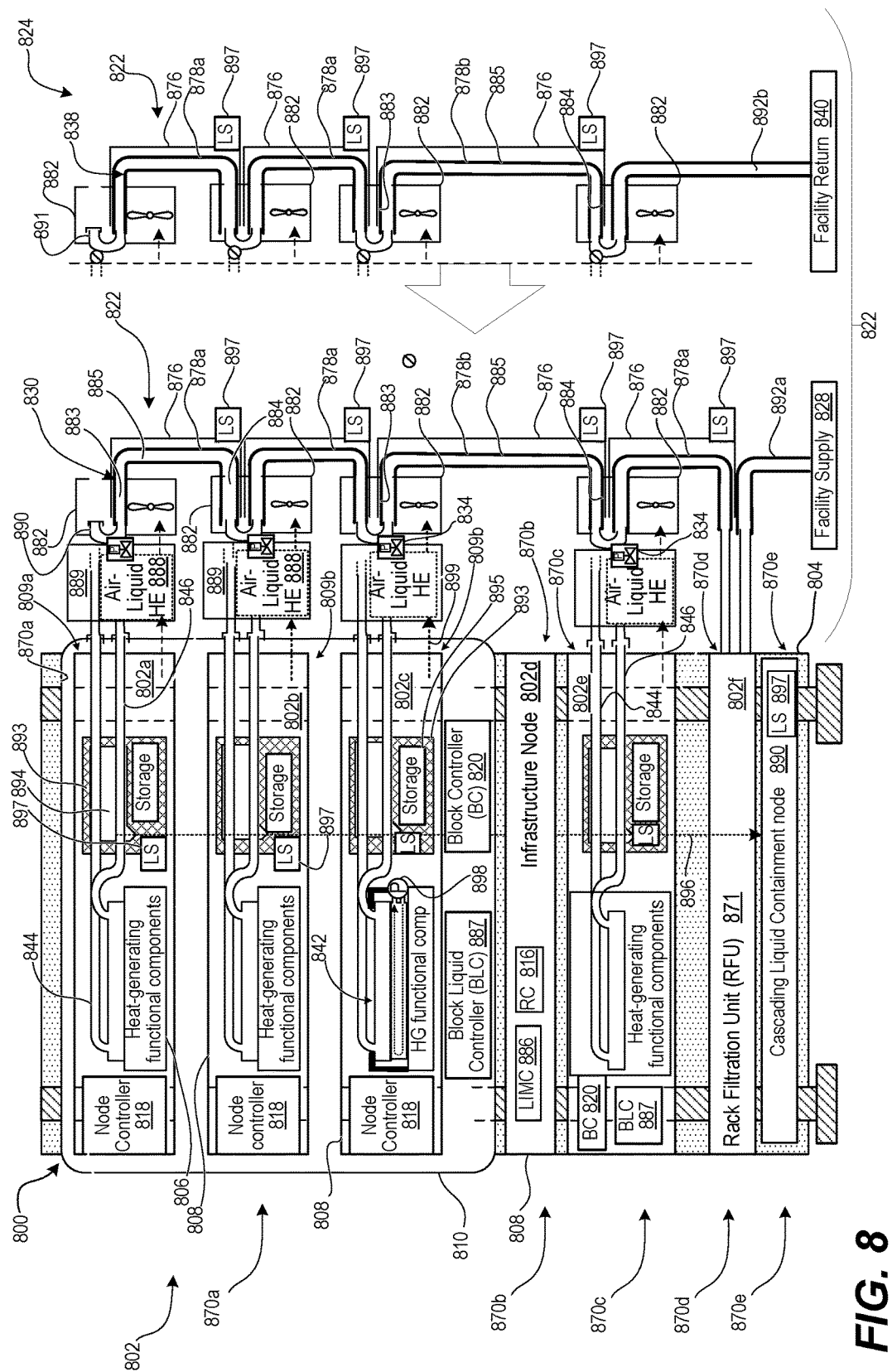
FIG. 8 illustrates a detailed block diagram of a DL RIHS configured with LC nodes arranged in blocks and which are cooled in part by a liquid cooling system having a rail comprised of MLD conduits, and in part by a subsystem of air-liquid heat exchangers, according to multiple embodiments.

FIG. 8 illustrates a more detailed view of the interconnections of the liquid cooling subsystem, at a node level and rack level within an example DL RIHS 800. As shown, RIHS 800 is configured with LC nodes 802a-802e arranged in blocks (e.g., block 1 comprising 802a-802c) and which are cooled in part by a liquid cooling system having a liquid rail comprised of MLD conduits, and in part by a subsystem of air-liquid heat exchangers, can be configured with heat-generating functional components 806 and that are cooled at least in part by a system of MLD conduits 878a-878b, according to one or more embodiments. Illustrated within nodes 802 are heat-generating functional components 806, such as processors, voltage regulators, etc., which emit heat during operation and or when power is applied to the component, such that the ambient temperature increases around the component, and within the node, and eventually within the block, and ultimately DL RIHS 800, during standard operation. To mitigate heat dissipation (and effects thereof), and to maintain the RIHS, block, node, and functional components within proper operating temperatures, DL RIHS 800 is configured with a DL subsystem 822. DL subsystem 822 includes a rack level network of liquid propagating pipes, or conduits that are in fluid communication with individual node level networks of liquid propagating conduits. Additionally, DL subsystem 822 collectively facilitates heat absorption and removal at the component level, the node level, the block level, and/or the rack level. The rack-level network of conduits includes a modular arrangement of a liquid rail 824 formed by more than one node-to-node MLD conduit 878a-878b spanning (or extending) between LC nodes 802 provisioned in rack 804.

At the top position of RIHS 800, a block chassis 810 is received in a block chassis receiving bay 870a of rack 804. Within block chassis 810, a first node 802a received in a first node receiving bay 809a of the rack 804 has a vertical height of one rack unit (1 U). A rack unit, U or RU as a unit of measure, describes the height of electronic equipment designed to mount in a 19-inch rack or a 13-inch rack. The 19 inches (482.60 mm) or 13 inches (584.20 mm) dimension reflects the horizontal lateral width of the equipment mounting-frame in the rack including the frame; the width of the equipment that can be mounted inside the rack is less. According to current convention, one rack unit is 1.75 inches (44.45 mm) high. A second node 802b received in a second node receiving bay 809b of the rack 104 (of FIG. 1) has a vertical height of 1 U. A third node 802c received in a third node receiving bay 809c of the rack 804 has a vertical height of 1 U. A fourth node 802d, infrastructure node 802b, is received in a second block chassis receiving bay 870b of rack 804 and has a vertical height of 1 U. Infrastructure node 802b can contain functional components such as a rack-level controller 816. A fifth node 802e is received in a third chassis receiving bay 870c and has a vertical height of 2 U. A sixth node 802f, which provides a Rack Filtration Unit (RFU) 871, is received in a fourth block chassis receiving bay 870d of the rack 804. Infrastructure node 802 and RFU 871 are examples of nodes 802 that may not require liquid cooling. A cascading liquid containment unit 890 is received in a fifth chassis receiving bay 870e and includes liquid sensor 897.

MLD conduits 878a of 1 U can be used to connect nodes of 1 U vertical spacing. Because of the additional 1 U separation of LC nodes 802c and 802e by inclusion of infrastructure node 802d, MLD conduit 878b between the third and fifth nodes 802c-802d is dimension 2 U to accommodate the increased spacing. MLD conduits 878a-878b can thus support different heights (1 U to/VU) of IT components.

Each MLD conduit 878a-878b includes first and second terminal connections 883, 884 attached on opposite ends of central conduit 885 that is rack-unit dimensioned to seal to a port of LC node 802 and enable fluid transfer between a port of a selected LC node 802 and a port of an adjacent LC node 802. In FIG. 8, facility supply 828 and facility return 840 are respectively located at the intake end of liquid rail 824 and the exhaust end of liquid rail 824. The actual location of facility supply 828 and facility return 840 can be reversed. Alternatively, facility supply 828 and facility return 840 can be located above the RIHS 800 or both conduits can be located on opposite sides of the RIHS 800 in alternate embodiments.

Liquid cooling subsystem 822 includes a liquid infrastructure manager controller (LIMC) 886 which is communicatively coupled to block liquid controllers (BLCs) 887 to collectively control the amount of cooling liquid that flows through the RIHS 800 and ultimately through each of the nodes 802 in order to effect a desired amount of liquid cooling at the component level, node level, block level, and rack level. For clarity, LIMC 886 and BLCs 887 are depicted as separate components. In one or more embodiments, the liquid control features of the LIMC 886 and BLCs 887 can be incorporated into one or more of the rack-level controller 816, block-level controllers 820, and the node-level controllers 818. As illustrated in FIG. 1 and previously described, each of the LIMC 886 and BLCs 887 are connected to and respectively control the opening and closing of flow control valves that determine the amount of flow rate applied to each block and to each node within the specific block. During cooling operations, one of LIMC 886 and BLC 887 causes a specific amount of liquid to be directly injected into the intake conduits of the LC node 802, which forces the cooling liquid through the system of conduits within the LC node 802 to the relevant areas and/or functional components/devices inside the nodes 802 to absorb and remove heat away from the inside of the node and/or from around the components within the node.

As another aspect, the present disclosure provides a modular approach to utilizing air-to-liquid heat exchanger 888 with quick connection and is scalable in both 1 U and 2 U increments. In one or more embodiments, DL cooling subsystem 822 can include a plurality of air-to-liquid (or liquid-to-air) heat exchangers 888 that facilitate the release of some of the heat absorbed by the exhaust liquid to the surrounding atmosphere around the RIHS 100 (of FIG. 1). Air-to-liquid heat exchangers 888 can be integral to block liquid manifold 889 that, along with the MLD conduits 878a-878b, form scalable liquid rail 824. One aspect of the present disclosure is directed to providing scalable rack-mounted air-to-liquid heat exchanger 888 for targeted heat rejection of rack-mounted equipment to DL cooling subsystem 822. Hot air 899 from auxiliary components, such as storage device 895, would be pushed through the air-to-liquid heat exchanger 888, and the resulting energy would transfer to liquid rail 824 and be rejected to a facility cooling loop, represented by the facility return 840.

RIHS 800 can include variations in LC node 802 that still maintain uniformity in interconnections along liquid rail 824 formed by a chassis-to-chassis modular interconnect system of MLD conduits 878a-878b. With this scalability feature accomplished using MLD conduits 878a-878b, cooling subsystem 822 of the RIHS 800 allows each block chassis 810 to be a section of a scalable manifold, referred herein as liquid rail 824, eliminating the need for a rack manifold. The scalability of liquid rail 824 enables flexible configurations to include various permutations of server and switch gear within the same rack (rack 804). MLD conduits 878a-878b can comprise standardized hoses with sealable (water tight) end connectors. Thus, the rack liquid flow network can encompass 1 to N IT chassis without impacting rack topology, space constraints, and without requiring unique rack manifolds. Additionally, according to one aspect, the MLD conduits are arranged in a pseudo daisy chain modular configuration, which allows for unplugging of one MLD conduit from one rack level without affecting liquid flow to and cooling of other rack levels.

The system of conduits extending from node intake valve 834 into each LC node 802 enables each LC node 802 to engage to block liquid manifold 889. Block chassis 810 or node enclosure 808 of each LC node 102 provides the intake and exhaust conduit connections to engage to respective terminals of MLD conduits 878a-878b within the MLD network provided by liquid rail 824. For example, where nodes 802 are designed as sleds, node enclosure 808 would be a sled tray, and each block would then include more than one sled tray received into block chassis 810, forming the extensions of block liquid manifold 889. Alternatively, the node enclosure 808 can be a single node chassis such as one of nodes 802c-802f.

Figure 9:
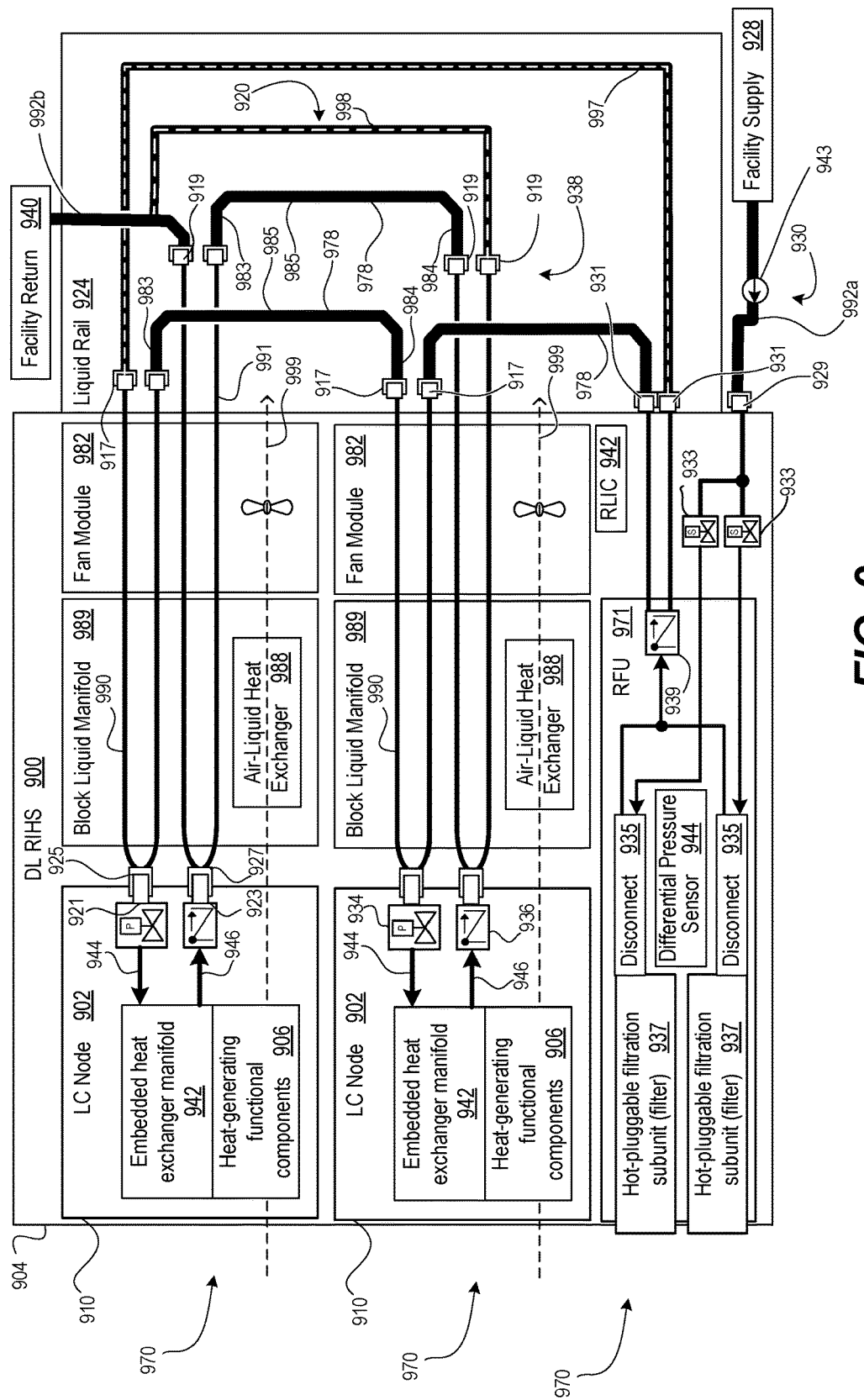
FIG. 9 illustrates an expanded, more detailed view of the liquid interconnection between the node level heat exchange manifold, the block liquid manifold containing the air-liquid heat exchanger, and example MLDs of the liquid rail, according to multiple embodiments.

Supply and return bypass tubes 890, 891 of each block liquid manifold 889 are connected by MLD conduits 878a-878b to form supply rail conduit 830 and return rail conduit 838. Due to constraints in the spacing within the figure, the tubing that extends from supply and return bypass tubes 890, 891 are not shown, and the valves are shown as if connected directly to the bypass. FIG. 9 provides a more accurate view of this feature of the disclosure, with conduits extended into the respective supply and return valves at each block. Also, for clarity, FIG. 8 illustrates the return rail conduit 838 separately. Liquid rail 824 enables multiple types of devices to be coupled together, each receiving an appropriately controlled portion of cooling liquid capacity. In one embodiment, liquid cooling subsystem 822 is passively pressurized by attaching MLD supply conduit 892a to facility supply 828 and an MLD return conduit 892b to facility return 840. Liquid flow from supply rail conduit 830 to return rail conduit 838 of liquid rail 824 can be controlled based upon factors such as a temperature of the liquid coolant, detected temperature within LC nodes 802, air temperature inside or outside of DL RIHS 800, etc.

In an exemplary embodiment, the scalable rack manifold provided by liquid rail 824 is formed in part by MLD conduits 878a-878b that run vertically in the back of the RIHS 800 with quick disconnects on the front and rear face of block liquid manifold 889 that allows for IT/infrastructure equipment respectively to be plugged into both front and back sides of the block liquid manifold 889. For example, LC nodes 802, such as server modules, can plug into the front side and fan modules 882 can plug onto the back side of block liquid manifold 889. This also allows for other liquid cooled devices such as LC Power Distribution Units (PDUs) to be plugged into the cooling liquid supply rail conduit 830 and return rail conduit 838 of liquid rail 824. Thereby, a rack hot pluggable cooling interface is created for any rack-mounted equipment.

Cooling subsystem 822 can support an embedded liquid-to-liquid heat exchanger manifold 842, such as in LC node 802c. Node liquid-to-liquid heat exchangers are provided for rejecting heat from one fluid source to a secondary source. One aspect of the present disclosure solves the problems that many shared-infrastructure IT systems (e.g., blade chassis) do not have adequate space to accommodate a liquid-to-liquid heat exchanger. Unlike with generally-known systems that rely upon liquid heat transfer having to exchange heat with an external liquid-to-liquid heat exchanger, the present disclosure enables on-rack liquid-to-liquid heat exchanger that does not require any of the vertical chassis space. Additionally, the present disclosure provides these benefits without requiring a central distribution unit (CDU), which takes up datacenter floor space. One aspect of the present disclosure provides embedded heat exchanger manifold 842 having a common heat transfer plate and a shared bulk header to create a combined liquid distribution manifold that includes a secondary liquid coolant for absorbing heat through the shared bulk header. In particular, the combined embedded heat exchanger manifold 842 rejects heat within shared node enclosure 808 such as node 802c to a secondary liquid coolant. Internal node supply 844 and return conduits 846 of a manifold built on top of a heat exchanger core allow heat transport within manifold 842. In one embodiment, closed system pump 898 can use a first coolant to cool a high thermal energy generating functional component such as a CPU or voltage regulator.

Additionally, the liquid cooling subsystem 822 also includes a filtration system or unit 871, which prevents chemical impurities and particulates from clogging or otherwise damaging the conduits as the fluid passes through the network of conduits. According to one aspect of the disclosure, liquid cooling subsystem 822 provides RFU 871 in fluid connection with the intake pipes from facility supply 828. In at least one embodiment, RFU 871 includes a sequenced arrangement of liquid filters within a full-sized sled that can be removably inserted by an end user into one of the receiving slots of rack 804. In one embodiment, the RFU 871 is located on an infrastructure sled having rack-level controllers and other rack-level functional components. In at least one embodiment, the entirety of the sled is filed with components associated with RFU 871. Thus, it is appreciated that the RFU 871 may occupy the entire area of one vertical slot/position within the chassis. Alternate locations of the RFU 871 can also be provided, in different embodiments, with an ideal location presenting the intake port of the RFU 871 in close proximity to a connection to facility supply 828 to directly receive the facility supply 828 prior to the liquid being passed into the remainder of the conduits of the liquid cooling subsystem 822. It is appreciated that if the system was capable of completing all heat exchange within the rack, then sealing the rack would be feasible and would reduce and/or remove any requirements for filtration and/or allocation of rack space for RFU 871.

Liquid cooled compute systems use the high heat transport capacity of water. However, the disclosure recognizes and addresses the fact that with liquid introduced into an electronic enclosure, there is a potential for leaks that can cause catastrophic system failure. Also, in some instances, a leak can create an electronic short with a resulting exothermal reaction causing permanent damage to the DL RIHS 800. To mitigate such risks, as one design feature, node-level carrier 893 can include a trench/gutter system for use as liquid containment structure 894. In one embodiment, the gutter system can also incorporate an absorbent material that can accumulate sufficient amounts of liquid from small leaks to enable external sensing of the leak. Advantageously, the carrier 893 can also be thermally conductive to serve as a heat sink for components such as storage devices 895. In one embodiment, another leak detection solution that can be incorporated into the LC node 802 involves use of a solenoid to create an event when additional current is applied, due to water pooling around the solenoid. Barriers on carrier 893 can be specifically designed to contain a liquid leak and assist in funneling the liquid through the gutter system. Liquid rail 824 can also be provided with leak containment and detection. In one or more embodiments, removable pipe covers 876 are sized to be mounted around respective MLD conduits 878a-878b and can include liquid sensors 897 for automatic alerts and shutdown measures.

In one or more embodiments, DL RIHS 800 further incorporates a node-level liquid containment structure 890 with a cascading drain runoff tubing network 896 to a rack-level cascading liquid containment structure 894. In one or more embodiments, the DL RIHS 800 further incorporates leak detection response such as partial or complete automated emergency shutdown. Liquid sensors (LS) 897 at various cascade levels can identify affected portions of DL RIHS 800. Containment and automatic shutoff can address the risks associated with a leak developing in the DL cooling system 822.

FIG. 9 illustrates a more detailed view of DL subsystem 920 associated with example DL RIHS 900. Within DL RIHS 900, each LC node 902 includes chassis 910 received in a respective chassis-receiving bay 970 of rack 904. Each LC node 902 contains heat-generating functional components 906. Each LC node 902 is configured with a system of internal supply conduit 944 and return conduit 946, associated with embedded heat exchanger manifold 942. Embedded heat exchanger manifold 942 receives direct injection of cooling liquid to regulate the ambient temperature of LC node 902. A node-level dynamic control valve 934 and node-level return check valve 936 control an amount of normal flow and provide shutoff and/or otherwise mitigate a leak. Cooling subsystem 920 provides cooling to heat-generating functional components 906 inside the LC node 902 by removing heat generated by heat-generating functional components 906. Liquid rail 924 is formed from more than one node-to-node, MLD conduit 978 between more than one LC node 902 within in rack 904. MLD conduits 978 includes first terminal connection 983 and second terminal connection 984. First terminal connection 983 and second terminal connection 984 are attached on opposite ends of central conduit 985. Central conduit 985 is rack-unit dimensioned to directly mate and seal to and enable fluid transfer between a selected pair of rail supply ports 917 and/or rail return ports 919 of a selected LC node 902 and an adjacent LC node 902.

The cooling subsystem 920 includes block liquid manifolds 989 mountable at a back side of the rack 904. Each block liquid manifold has at least one rail supply port 917 and at least one rail return port 919 on an outside facing side of the block liquid manifold 989. The at least one rail supply port 917 and the at least one rail return port 919 respectively communicate with at least one block supply port 921 and a block return port 923 on an inside facing side of the block liquid manifold 989. LC nodes 902 are insertable in receiving bays 970 of rack 904 corresponding to locations of the mounted block liquid manifolds 989. Block supply ports 921 and block return ports 923 of the LC nodes 902 and an inside facing portion of the corresponding block liquid manifold 989 are linearly aligned. The linear alignment enables direct sealing, for fluid transfer, of the lineally aligned inside manifold supply ports 925 and return ports 927 to the inside facing portion of the block liquid manifold 989. In one or more embodiments, block supply port 921 sealed to the internal manifold supply port 925 communicates via supply bypass tube 990 to two rail supply ports 917. Block return port 923 sealed to internal manifold return port 927 communicates via return bypass tube 991 of the respective block liquid manifold 989 to two rail return ports 919. Fan modules 982 mounted respectively onto back of block liquid manifold 989 have apertures to expose rail supply 917 and return ports 919. Additionally, fan modules 982 draw hot air 999 from LC nodes 902 through an air-liquid heat exchanger 988 in block liquid manifold 989.

In one or more embodiments, supply liquid conduit 992a is attached for fluid transfer between facility supply 928 and rail supply port 917 of block liquid manifold 989 of RIHS 900. A return liquid conduit 992b can be attached for fluid transfer between rail return port 919 of block liquid manifold 989 to facility return 940. FIG. 9 further illustrates that the fluid connection to facility supply 928 includes RFU 971. To prevent contamination or causing damage to cooling subsystem 920, RFU 971 is received in bay 970 of rack 904 and includes one of two input ports 929 connected via supply liquid conduit 992a to facility supply 928. The RFU 971 includes one of two output ports 931 that is connected to MLD conduit 978 of supply rail conduit 930. Liquid rail 924 also includes return rail conduit 938. RFU 971 controls two parallel emergency shutoff valves 933 for controlling the liquid flow received from input port 929 and which is provided via hot-pluggable disconnects 935 to two replaceable filtration subunits ("filters") 937. The flow of cooling liquid from supply input port 929 flows in parallel to two replaceable filtration subunits 937, automatically diverting to the other when one is removed for replacing. Thereby, filtration and cooling of RIHS 900 can be continuous, even when one filter is removed and/or one of the valves malfunctions (e.g., does not open). Back-flow is prevented by check valve 939 that allows normal flow to exit to output port 931. Differential pressure sensor 944 measures the pressure drop across filters") 937 and provides an electrical signal proportional to the differential pressure. According to one aspect, a Rack Liquid Infrastructure Controller (RLIC) 942 can determine that one filter 937 is clogged if the differential pressure received from differential pressure sensor 944 falls below a pre-determined value.

In one or more embodiments, RIHS 900 can provide hot-pluggable server-level liquid cooling, an integrated leak collection and detection trough, and an automatic emergency shut-off circuit. At a block level, RIHS 900 can provide embedded air-to-liquid heat exchange, and dynamic liquid flow control. At a rack level, RIHS 900 can provide facility-direct coolant delivery, a scalable rack fluid network, a rack filtration unit, and automated rack flow balancing, and a service mode.

According to one embodiment, liquid rail 924 includes a series of secondary conduits, such as supply divert conduit 997 and return divert conduit 998 that provides a by-pass fluid path for each of MLD conduits 978. In operation, divert conduit 997 allows for the removal of corresponding MLD conduit 978, thus removing the flow of cooling liquid to the particular block of nodes, without interrupting the flow of cooling liquid to the other surrounding blocks of computer gear. For example, a particular MLD conduit 978 can be replaced due to a leak. For another example, a block liquid manifold 989 can be replaced. The inclusion of divert conduits 997, 998 thus enables rapid servicing and maintenance of block liquid manifold 989 and/or nodes within block chassis without having to reconfigure the MLD conduits 978. In addition, the RIHS 900 can continue operating as cooling liquid continues to be provided to the remainder of the blocks that are plugged into the liquid rail. Re-insertion of the MLD conduit 978 then reconnects the flow of cooling liquid to the block for normal cooling operations, and shuts off the diverted flow of cooling liquid. In an exemplary embodiment, the MLD conduits 978 provide a quick disconnect feature that interrupts flow when not fully engaged to a respective port 917, 919, 921, 923. Disconnection of an MLD conduit 978 interrupts flow in a primary portion of the liquid rail 924 for either supply or return, shifting flow through one or more divert conduits 997 to provide cooling liquid to the other block liquid manifolds 989. In one or more embodiments, a manual or active shutoff valve can interrupt flow on either or both of the primary or divert portions of the liquid rail 924.

Figure 10:
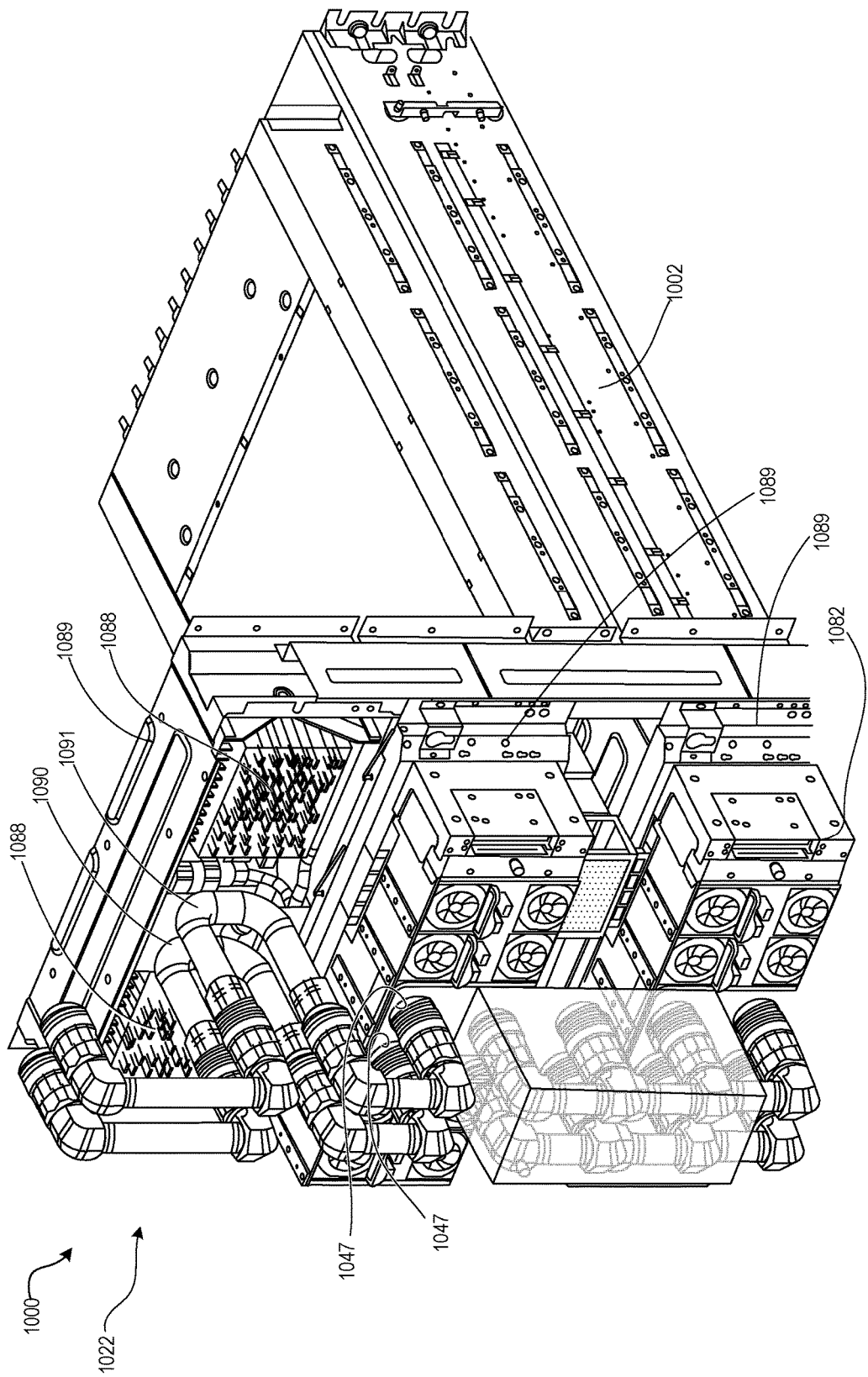
FIG. 10 illustrates a perspective view of a portion of a DL RIHS depicting example nodes, block radiators with Air-Liquid heat exchangers, and MLD conduits, according to one or more embodiments.

FIG. 10 illustrates a more detailed view of the internal makeup of the rails and other functional components of the cooling subsystem 1022 of example RIHS 1000. According to one embodiment, cooling subsystem 1022 also includes air movers and/or other devices to provide for forced air cooling in addition to the direct injection liquid cooling. As shown by FIG. 10, at least one fan module 1082 is rear mounted to a block liquid manifold 1089 in which an air-to-liquid heat exchanger (or radiator) 1088 is incorporated. Fan module 1082 provides air movement through chassis 1010 and/or node enclosure 1008 of node 1002 as well as through air-to-liquid heat exchanger 1088. Each block liquid manifold 1089 includes supply bypass tube 1090 and return bypass tube 1091 through which a dynamically determined amount of cooling liquid is directed into respective node 1002 while allowing a bypass flow to proceed to the next node/s 1002 in fluid path of the intake flow. Fan module 1082 includes apertures 1047 through which supply bypass tubes 1090 and return bypass tubes 1091 are extended, according to one embodiment. Nodes 1002 are connected into the backside of block liquid manifold 1089 with the ends of intake and exhaust liquid transfer conduits in sealed fluid connection with supply bypass tubes 1090 and return bypass tubes 1091, respectively.

Controlling Exhaust Air Temperature using Liquid Flow Control in a DL RIHS

Figure 11:
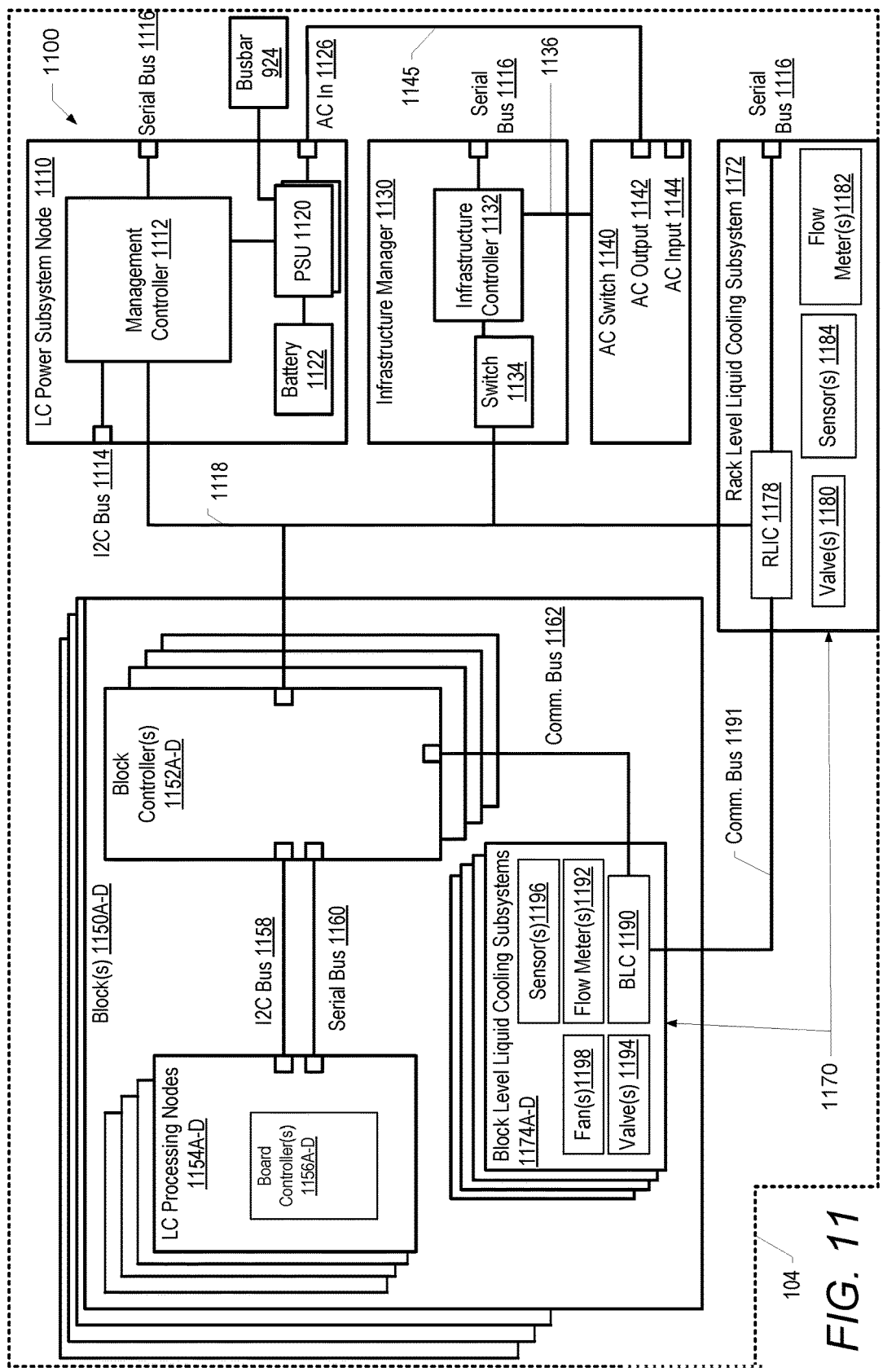
FIG. 11 is a block diagram illustration of an example DL RIHS, according to one or more embodiments.

FIG. 11 illustrates a block diagram representation of an example DL RIHS 1100, within which one or more of the described features of the various embodiments of the disclosure can be implemented. Referring specifically to FIG. 11, there is illustrated a two-dimensional block diagram of an example DL RIHS 1100 configured within a liquid-cooled, modular, expandable rack with modular configuration of various functional components inserted therein. DL RIHS 1100 includes rack 104, which can comprise one or more panels of sheet metal or other material interconnected to form a three dimensional volume (as illustrated in FIGS. 3-7), which is generally referred to in the industry as a rack. The various components are communicatively connected to one or more other components via power and communication cables (or buses) (e.g. communication bus 1191, communication bus 1162, serial bus 1160), which are generally represented by the connecting lines of FIG. 11. DL RIHS 1100 comprises a hierarchical arrangement of liquid cooled processing nodes, liquid cooled power subsystem nodes and other functional processing components or IT gear located within end nodes or servers.

In the illustrated embodiment, in addition to the previously introduced LC server nodes, DL RIHS 1100 comprises an LC power subsystem node 1110, which includes a management controller (MC) 1112 communicatively connected to one or more power supply units (PSUs) 1120. In one embodiment, PSUs 1120 are liquid cooled. MC 1112 can receive power supply data and settings from PSUs 1120. PSUs 1120 are connected to an alternating current (AC) input power terminal 1126 that provides a source of AC power to PSUs 1120. Backup battery 1122 is connected to PSUs 1120 to supply backup system power in case of a loss of primary power (e.g., AC power) to DL RIHS 1100. An AC switch 1140 controls the connection of AC power to DL RIHS 1100. AC switch 1140 has an AC input terminal 1144 and an AC output terminal 1142. An AC power cable 1145 is connected between and supplies AC power from AC switch 1140 to PSUs 1120.

MC 1112 is communicatively connected to a communication bus 1118 and an I2C bus 1114. In one embodiment, communication bus 1118 can be an Ethernet cable providing connection via an Ethernet network. Communication bus 1118 is communicatively connected between MC 1112 and switch 1134 of infrastructure manager (IM) 1130. Switch 1134 of Infrastructure manager (IM) 1130 is communicatively connected to IM controller 1132. Switch 1134 enables IM controller 1132 to communicate with block controllers 1152A-D via communication bus 1118. According to at least one embodiment, MC 1112 and IM 1130 provide certain control and/or management signals to block controllers 1152A-D via communication bus 1118. IM controller 1132 is communicatively connected to AC switch 1140 and to serial bus 1116.

DL RIHS 1100 further comprises a plurality of processing blocks 1150A-D. Processing blocks 1150A-D comprise block controllers 1152A-D, LC processing nodes 1154A-D and block-level liquid cooling subsystems 1174A-D. Each of block controllers 1152A-D are communicatively connected to communication bus 1118. Within each block 1150 is at least one, and likely a plurality of LC processing nodes 1154A-D, generally referred to as LC nodes 1154A-D, and synonymous with the previously-introduced LC nodes within the previous figures. As one aspect of the disclosure, the number of nodes that can be placed within each block and/or can be supported by a single block controller, and can vary based on the block dimension relative to the size and configuration of each processing node. Additionally, one or more of the blocks can be utilized to provide rack-storage of storage devices. Each LC node 1154 that is controlled by a respective block controller 1152 is communicatively coupled to block controller 1152 via an I2C bus 1158 and a serial bus 1160. Each LC node 1154A-D includes board controller 1156A-D that can control one or more aspects of the operation of that LC node 1154A-D.

DL RIHS 1100 further comprises a liquid cooling control subsystem 1170 that includes a rack-level liquid cooling subsystem 1172 and block-level liquid cooling subsystems 1174A-D. In one embodiment, rack-level liquid cooling subsystem 1172 is physically located on a liquid instrumentation management circuit board and block-level liquid cooling subsystems 1174A-D are physically located on a block liquid control circuit board. Rack-level liquid cooling subsystem 1172 controls the overall liquid cooling of DL RIHS 1100, while block-level liquid cooling subsystems 1174A-D control the liquid cooling of individual blocks 1150A-D and the LC nodes within the particular block.

Rack-level liquid cooling subsystem 1172 includes a rack-level liquid infrastructure controller (RLIC) 1178 that is communicatively coupled to each of block controllers 1152 via communication bus 1118 and to each of the block-level liquid cooling subsystems 1174A-D via communication bus 1191. RLIC 1178 is also communicatively coupled to serial bus 1116 for communication with MC 1112. Rack-level liquid cooling subsystem 1172 further includes one or more supply valves 1180, one or more sensors 1184, and one or more flow meters 1182. RLIC 1178 is communicatively coupled to supply valve 1180, sensors 1184 and flow meters 1182. In one embodiment, supply valve 1180 can control an incoming cooling liquid supply flow rate to DL RIHS 1100. In another embodiment, supply valves can control an incoming or an outgoing (return) cooling liquid supply rate of DL RIHS 1100. Sensors 1184 can be temperature sensors that record temperature within DL RIHS 1100. Flow meters 1182 can measure flow rates of cooling liquid within DL RIHS 1100. RLIC 1178 can receive electrical signals containing data and measurements from supply valve 1180, sensors 1184, and flow meters 1182. Also, RLIC 1178 can transmit electrical signals and/or communicate data, instructions and settings to supply valve 1180, sensors 1184, and flow meters 1182.

Each of block-level liquid cooling subsystems 1174A-D includes a block liquid controller (BLC) 1190 that is communicatively coupled to a respective block controller 1152 via communication bus 1162 and to RLIC 1178 via communication bus 1191. Block-level liquid cooling subsystems 1174A-D further include one or more liquid control valves 1194, one or more sensors 1196, one or more flow meters 1192, and one or more fan modules 1198.

BLC 1190 is communicatively coupled to liquid control valves 1194, sensors 1196, flow meters 1192, and fan modules 1198. In one embodiment, liquid control valves 1194 can control an incoming cooling liquid supply flow rate to blocks 1150. Alternatively and/or in addition, liquid control valves 1194 can control an outgoing (return) cooling liquid supply rate. In an embodiment, sensors 1196 can be temperature sensors that sense temperatures within LC processing nodes 1154 and flow meters 1192 can measure flow rates of cooling liquid within blocks 1150. BLC 1190 can receive electrical signals containing data and measurements from liquid control valves 1194, sensors 1196, flow meters 1192, and fan modules 1198. BLC 1190 can also transmit electrical signals containing data, instructions and settings to liquid control valves 1194, sensors 1196, flow meters 1192, and fan modules 1198.

According to one aspect of the disclosure, liquid cooling control subsystem 1170 and specifically RLIC 1178 can receive an incoming cooling liquid supply flow rate corresponding to an amount and rate of incoming cooling liquid supply being supplied to DL RIHS 1100. The flow rate can be measured by flow rate meter 1192. RLIC 1178 calculates a maximum flow rate cap for each of the LC nodes 1154A-D and transmits the maximum flow rate cap to each of the LC nodes. RLIC 1178 triggers each of the LC nodes to adjust their respective flow rates to correspond to the received maximum flow rate cap.

One aspect of the disclosure is an appreciation that to ensure effective cooling of the DL RIHS 1100, it may be necessary to adjust the cooling liquid flow rates to the overall DL RIHS 1100 and to also adjust the cooling liquid flow rates to individual blocks, processing nodes and components of DL RIHS 1100. In particular, it may be necessary to provide real-time increases of cooling liquid flow rates to LC nodes 1154A-D that are consuming high levels of power and thus generating higher than normal/average levels of heat.

Figure 12:
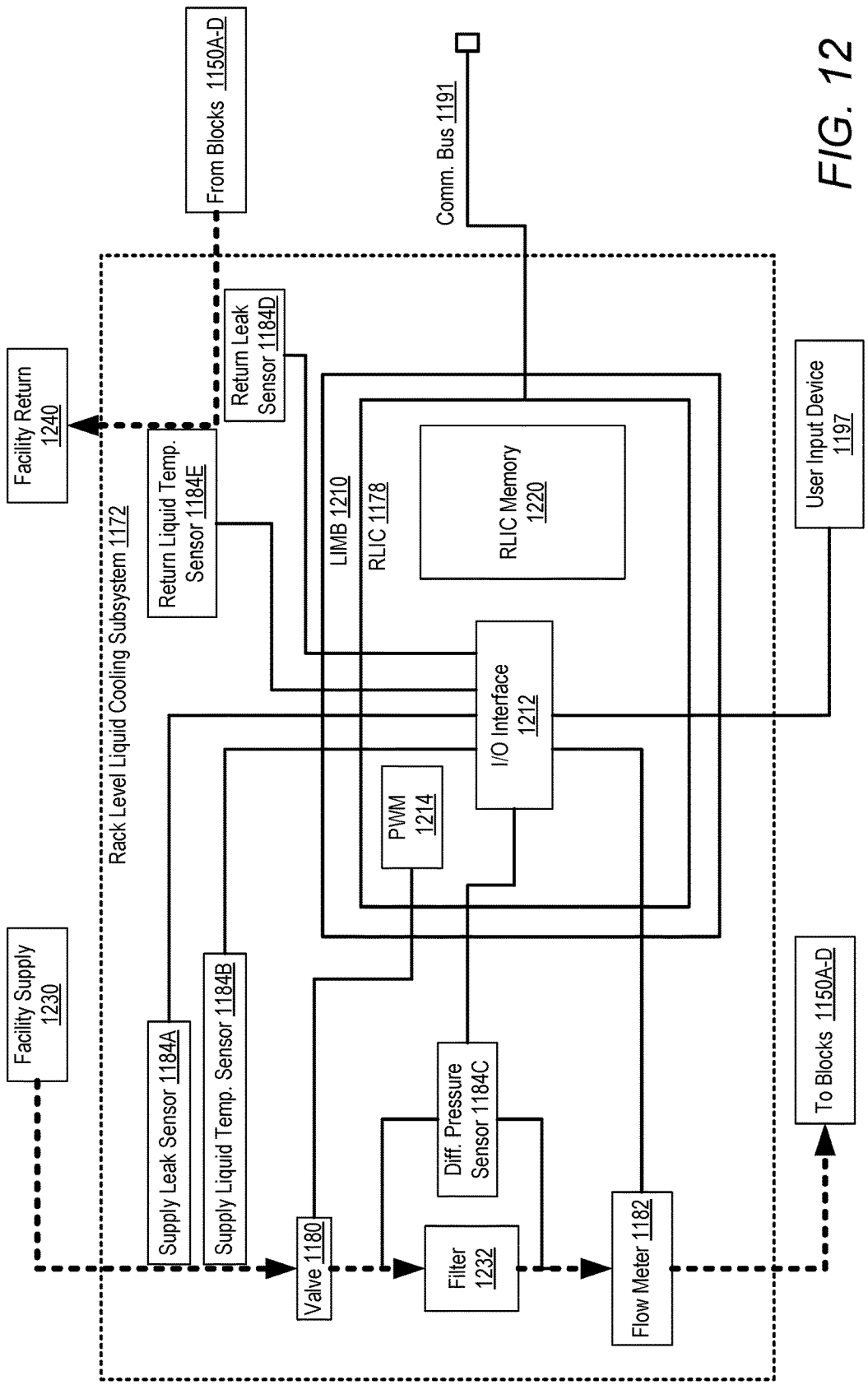
FIG. 12 is a block diagram illustrating the connectivity of components within a rack-level cooling subsystem for controlling liquid cooling of LC nodes in a DL RIHS via a rack-level liquid cooling infrastructure controller, in accordance with one embodiments.

FIG. 12 illustrates further details of the connectivity of functional components within rack level liquid cooling subsystem 1172 for controlling liquid cooling of LC nodes 1154A-D within DL RIHS 1100. Rack level liquid cooling subsystem 1172 includes RLIC 1178 that is physically located on liquid instrumentation management circuit board (LIMB) 1210. RLIC 1178 includes I/O interface 1212, pulse width modulation (PWM) circuit 1214 and RLIC memory 1220. In one embodiment, RLIC memory 1220 can be a non-volatile memory device such as flash memory. RLIC memory 1220 can store algorithms and firmware that, when executed by RLIC 1178, perform one or more of the processes and methods described herein. PWM circuit 1214 generates PWM signals that can control the operation of connected devices such as the open position of supply valve 1180. I/O interface 1212 enables communication between RLIC 1178 and other connected devices such as valves, sensors, and flow meters.

Facility supply 1230 is a source of cooling liquid for DL RIHS 1100. In one embodiment, facility supply 1230 can provide a fluid, such as water. Facility supply 1230 is in fluid communication with supply valve 1180. Supply valve 1180 is in fluid communication with filter 1232, which in one embodiment is synonymous with hot-pluggable filtration subunit 937 (FIG. 9). Filter 1232 can remove contaminants or particulates from the cooling liquid. Filter 1232 is in fluid communication with flow meter 1182, which is in fluid communication with liquid cooling components of blocks 1150A-D.

From a block-level perspective, cooling liquid flows from incoming facility supply 1230, through supply valve 1180, filter 1232, and then on to liquid cooling components of blocks 1150A-D. After the cooling liquid has removed heat from blocks 1150A-D the cooling liquid flows to facility return 1240. According to one or more embodiment, the cooling liquid received at facility return 1240 can be recirculated for use or discarded or otherwise used at the facility.

The incoming flow rate of cooling liquid to DL RIHS 1100 can be regulated by supply valve 1180. Supply valve 1180 is communicatively coupled to PWM circuit 1214. Supply valve 1180 can be placed in different states of openness, ranging from fully closed (with no liquid flow) to fully open (for full or maximum liquid flow). RLIC 1178 can control the open state/position of (and thus the liquid flow rate permitted through) supply valve 1180, thereby regulating the flow rate and amount of cooling liquid being supplied to DL RIHS 1100.

I/O interface 1212 is further communicatively coupled to supply leak sensor 1184A, supply liquid temperature sensor 1184B, and differential pressure sensor 1184C. Supply leak sensor 1184A can detect leaks in facility supply 1230. Liquid temperature sensor 1184B can measure the temperature of the incoming cooling liquid and provide an electrical signal proportional to the temperature of the incoming cooling liquid. Differential pressure sensor 1184C measures the pressure drop across filter 1232 and provides an electrical signal proportional to the differential pressure. According to one aspect, RLIC 1178 can determine that filter 1232 is clogged if the differential pressure received from differential pressure sensor 1184C falls below a pre-determined value.

I/O interface 1212 is further communicatively coupled to flow meter 1182. Flow meter 1182 can measure a flow rate of cooling liquid being supplied to DL RIHS 1100 and provide an electrical signal proportional to the flow rate to RLIC 1178 via I/O interface 1212. I/O interface 1212 is further communicatively coupled to return leak sensor 1184D and return liquid temperature sensor 1184E. Return leak sensor 1184D can detect leaks in facility return 1240. Return liquid temperature sensor 1184E can measure the temperature of the return (outgoing) cooling liquid exiting from RIHS and provide an electrical signal proportional to the temperature of the return cooling liquid. A user input device 1197 is communicatively coupled to I/O interface 1212. In one embodiment, user input device 1197 can include a keyboard, mouse and/or touch pad. User input device 1197 can allow an IT manager or system administrator to input a desired exterior ambient temperature for a rack or block and to modify that value as needed.

Figure 13:
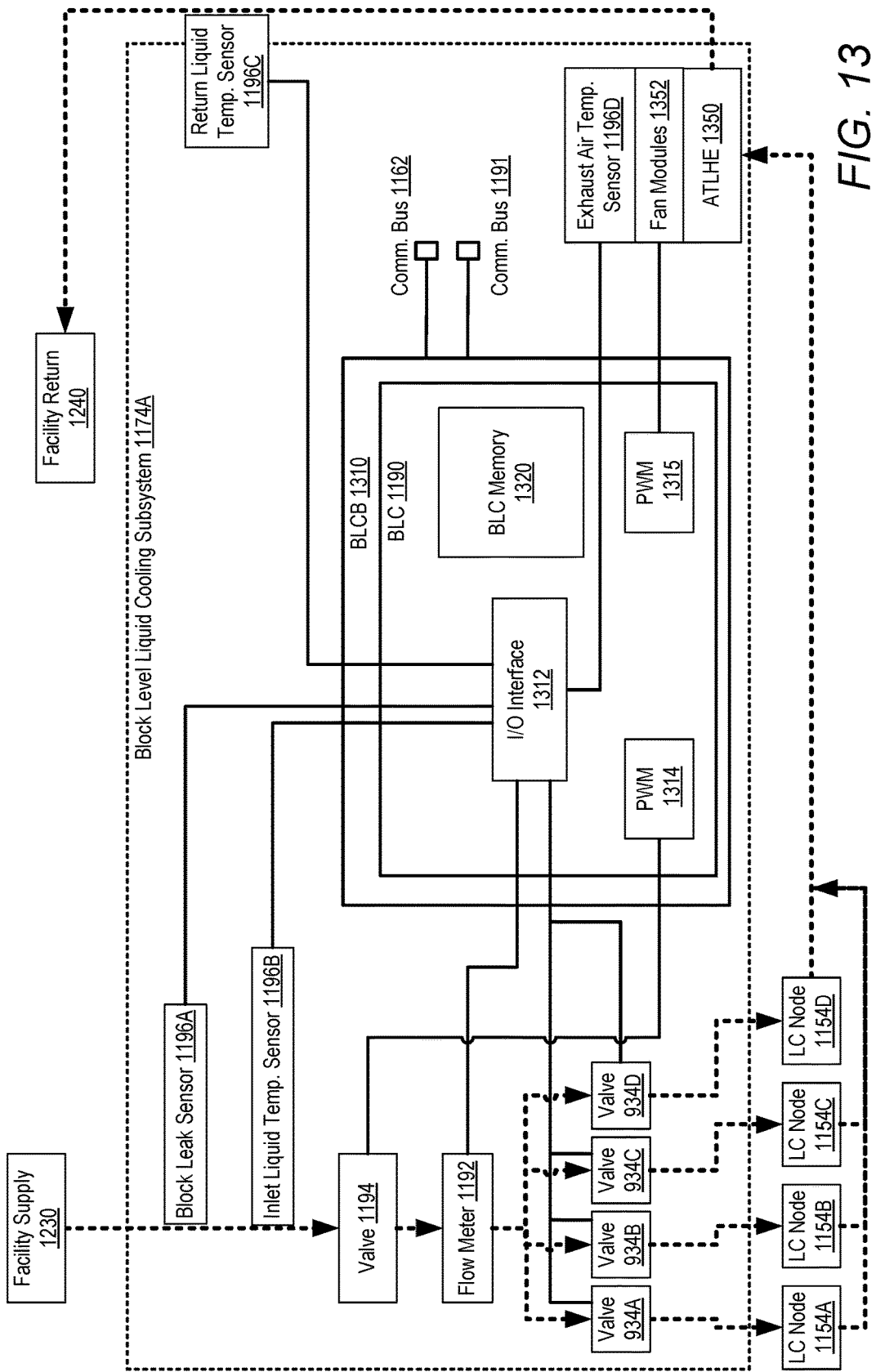
FIG. 13 is a block diagram illustrating the connectivity of components within a block level cooling subsystem for controlling liquid cooling of LC nodes in a DL RIFTS via a block liquid controller, in accordance with one embodiments.

FIG. 13 illustrates further details of the connectivity of functional components within a block-level liquid cooling subsystem 1174 and specifically within block-level liquid cooling subsystem 1174A that controls liquid cooling of LC processing nodes within DL RIHS 1100. Block-level liquid cooling subsystem 1174A includes BLC 1190, which is physically located on block liquid circuit board (BLCB) 1310. BLC 1190 includes I/O interface 1312, pulse width modulation (PWM) circuit 1314, and BLC memory 1320. In one embodiment, BLC memory 1320 can be a non-volatile memory device such as flash memory. BLC memory 1320 can store algorithms and firmware that, when executed by BLC 1190, enables BLC 1190 to perform one or more of the processes and methods described herein. PWM circuit 1314 generates PWM signals that can control the operation of connected devices, such as the open position of liquid control valve 1194. I/O interface 1312 enables communication between BLC 1190 and other connected devices such as valves, sensors, and flow meters.

As described herein, facility supply 1230 provides cooling liquid for each of the blocks 1150A-D. Specifically, facility supply 1230 provides cooling liquid that is in fluid communication with block liquid control valve 1194. The block liquid control valve 1194 is in fluid communication with flow meter 1192, which is in fluid communication with the LC processing nodes 1154A-D.

At the block and node levels, the flow path of cooling liquid runs from facility supply 1230, through block liquid control valve 1194, through flow meter 1192, through node input valves 934A-D and then on to liquid cooled components associated with and located within LC nodes 1154A-D. LC nodes 1154A-D respectively include node-level input valves 934A-D and check valves 936, and each LC node includes a system of conduits extending through the LC node, as provided above in the description of the preceding figures (e.g., FIGS. 2 and 9). The cooling liquid flows through the LC nodes' system of conduits and absorbs and removes heat from within LC nodes 1154A-D. In one embodiment, the cooling liquid also flows to the liquid-to-air heat exchanger (ATLHE) 1350. ATLHE 1350 corresponds to air to liquid heat exchangers 988 of FIG. 9. In a closed loop configuration, ATLHE 1350 is mounted to a back-of-rack section of each of LC nodes 1154A-D. Each ATLHE 1350 receives cooling liquid returning from LC processing nodes 1154A-D and the cooling liquid is passed through ATLHE 1350 that receives a variable air flow supplied by one or more fan modules 1352. After exiting ATATLHE 1350, the cooling liquid returns to facility return 1240.

The flow rate of cooling liquid within block 1150A (FIG. 12) can be regulated by liquid control valve 1194, which is a proportional valve mounted in proximity to block 1150A. Liquid control valve 1194 is communicatively coupled to PWM circuit 1314. BC 1152, through BLC 1190, can control the open position of (i.e., the percentage open from a closed position (o %) to a fully open position (100%), and thus the flow rate supported by, liquid control valve 1194 by regulating a PWM signal to valve 1194. BC 1152 and/or BLC 1190 are thus able to regulate the flow rate of cooling liquid being supplied to LC processing nodes 1154A-D and also the amount or volume of cooling liquid that flows through the ATLHE 1350 to absorb heat from the air flow through the LC node 1154.

I/O interface 1312 is communicatively coupled to block leak sensor 1196A, a block inlet liquid temperature sensor 1196B, an exhaust air temperature sensor 1196D and a block exterior space temperature sensor 1196E. Block leak sensor 1196A can detect cooling liquid leaks within block 1150A. Block inlet temperature sensor 1196B can measure the temperature of the cooling liquid entering block 1150A (FIG. 12) and provide an electrical signal proportional to the temperature of the incoming cooling liquid. Exhaust air temperature sensor 1196D can measure the temperature of the exhaust air leaving ATLHE 1350 and provide an electrical signal proportional to the temperature of the exhaust air. Block exterior space temperature sensor 1196E measures the temperature of air within the physical confines of block chassis 810 and provides an electrical signal proportional to the temperature of the air Fan modules 1352 of ATLHE 1350 are communicatively coupled to PWM circuit 1314. BLC 1190 can control the fan speed of fan modules 1352 by regulating a PWM signal to fan modules 1352. By regulating the PWM signal to fan modules 1352, BLC 1190 regulates the air flow rate of air being supplied to ATLHE 1350.

I/O interface 1312 is further communicatively coupled to flow meter 1192. Flow meter 1192 can measure a flow rate of cooling liquid flowing through block 1150A and provide an electrical signal proportional to the flow rate to BLC 1190 via I/O interface 1312. I/O interface 1312 is further communicatively coupled to return liquid temperature sensor 1196C. Return liquid temperature sensor 1196C can measure the temperature of the return (outgoing) cooling liquid from block 1150A and provide an electrical signal proportional to the temperature of the return cooling liquid.

The flow rate of cooling liquid within each of the LC processing nodes 1150A-D can be regulated by node input valves 934A-D. Node input valves 934A-D are communicatively coupled to PWM circuit 1314. BLC 1190 can control the open position of (and flow rate supported by) of each of the node input valves 934A-D by regulating a PWM signal to the valves. BLC 1190 is thus able to regulate the flow rate of flow and/or amount of cooling liquid being supplied to each of the LC processing nodes 1154A-D.

Figure 14:
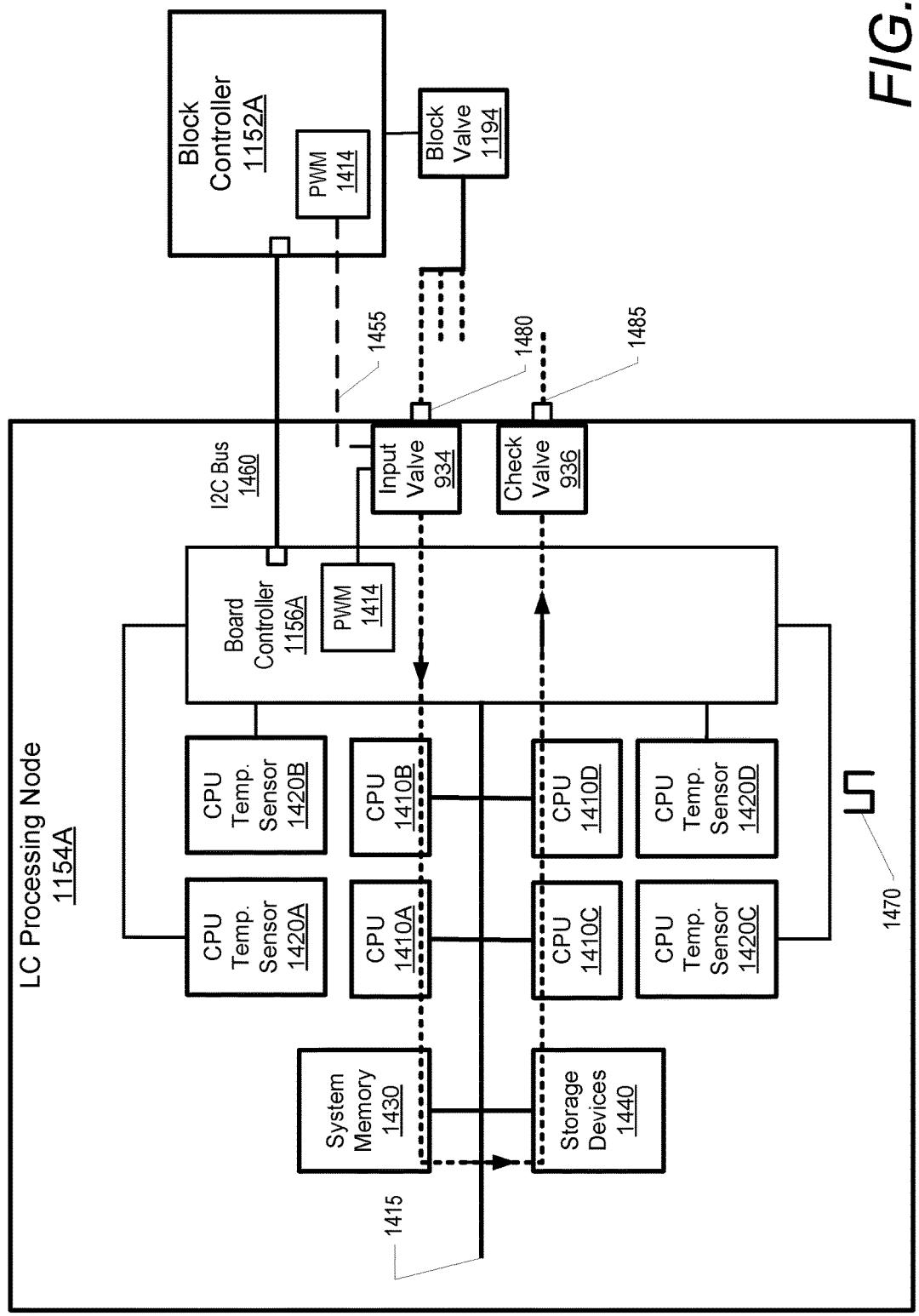
FIG. 14 is a block diagram further illustrating the connectivity of components within the DL RIHS and specifically further illustrating components of an LC node, in accordance with one embodiments.

With reference now to FIG. 14, there is illustrated one embodiment of a single LC node 1154 and in particular LC node 1154A. In the illustrative embodiments, LC node 1154A includes a sled on and/or within which the components of LC node are installed. The sled can be slid into and out of the sled receiving front bay of the block chassis. LC processing node 1154A comprises one or more processors or central processing units (CPUs) 1410A, 1410B, 1410C and 1410D, (collectively CPUs 1410A-D) that are communicatively connected to a system memory 1430 and storage device(s) 1440 via a system bus 1415. Storage device(s) 1440 can be utilized to store one or more software and/or firmware modules and/or data (not specifically shown). In one embodiment, storage device(s) 1440 can be a hard drive or a solid-state drive. In some embodiments, LC node 1150 can actually be a storage node providing a sled in which a large number of storage devices are hosted, where the storage devices are specifically configured to store mass amounts of data.

CPUs 1410A-D are also communicatively connected to board controller 1156A via system bus 1415. In one embodiment, board controller 1156A can reside on a motherboard that also contains CPUs 1410A-D. Board controller 1156A is communicatively connected to block controller 1152A by an I2C bus 1460. Board controller 1156A can facilitate communication between CPUs 1410A-D and block controller 1152A. Board controller 1156A can include a PWM circuit 1414 that is communicatively coupled to node level input valve 934. In one embodiment PWM circuit 1414 can be located within block controller 1152A and can be communicatively coupled to node level input valve 934 via one or more cables or signal buses 1455. Block valve 1194 is in fluid communication with input valve 934 via node supply port 1480. LC node 1154A includes a check valve 936 that has a node return port 1485. LC node 1154A receives cooling liquid via node supply port 1480 and input valve 934. The CPUs, system memory and storage devices are cooled by the circulating cooling liquid. The cooling liquid exits LC node 1154A via check valve 936 and node return port 1485.

LC node 1154A further includes temperature sensors 1420A, 1420B, 1420C and 1420D, (collectively temperatures sensors 1420A-D) that are communicatively connected to board controller 1156A. In the illustrative embodiment, temperatures sensors 1420A-D are mounted in thermal contact with CPUs 1410A-D such that temperatures sensors 1420A-D can accurately measure the operating temperatures of CPUs 1410A-D. Temperatures sensors 1420A-D can measure the temperature of their respective CPU and provide an electrical signal (temperature sensor signal 1470) that is proportional to the measured temperature to board controller 1156A. Board controller 1156A can receive temperature sensor signal 1470 and transmit the temperature sensor signal 1470 to block controller 1152A, which can transmit the temperature sensor signal 1470 to BC 1152 (FIG. 13).

According to one aspect, the majority of the processing operations performed within the block is performed by BC 1152. BC 1152 can then trigger BLC 1190 to perform certain actions, such as opening and closing of valves, etc. In one embodiment, BC 1152 can receive a temperature sensor signal 1470 from each of CPUs 1410A-D associated with LC processing nodes 1154A-D within each of the blocks 1150A-D (FIG. 11). BC 1152 can identify a highest magnitude temperature from among the received temperature sensor signals 1470 for each of LC nodes 1154A-D. BC 1152 can retrieve, from BLC memory 1320, a first operating temperature set point associated with the LC node having the highest magnitude temperature. BC 1152 can then calculate a liquid flow rate for each of the LC nodes based on the highest magnitude temperature value and the first operating temperature set point. BC 1152 can trigger each of the LC nodes to move their respective liquid control valves 934A-D (i.e. via PWM circuit 1114) to a position corresponding to the calculated flow rate such that sufficient cooling liquid is provided to each of the LC nodes 1154A-D.

Figure 15B:
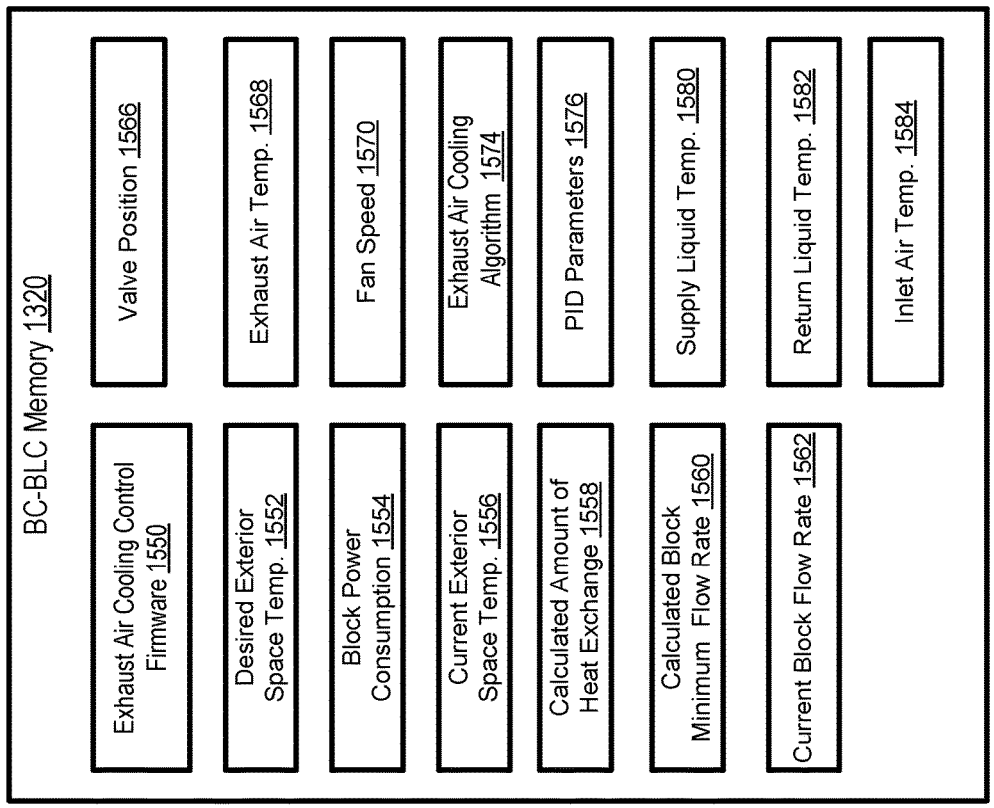
FIG. 15B is a block diagram illustrating example memory contents of the block liquid controller, in accordance with one embodiments.
Figure 15A:
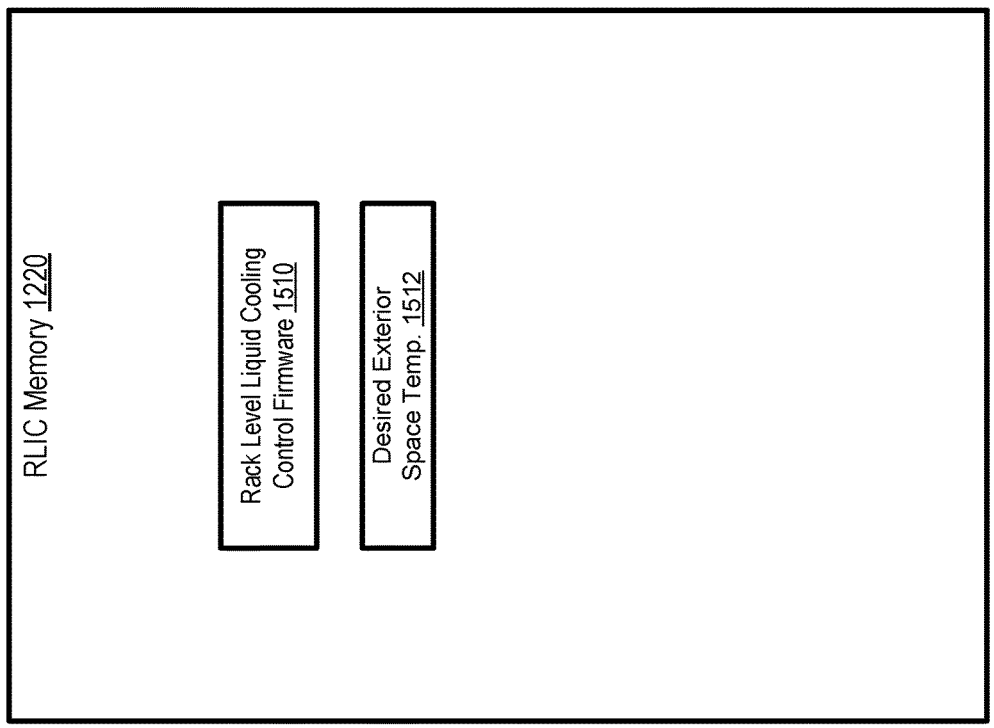
FIG. 15A is a block diagram illustrating example memory contents of the liquid cooling infrastructure controller, in accordance with one embodiments.

FIGS. 15A and 15B illustrate further details of example contents of RLIC memory 1220 and BC-BLC memory 1320. With specific reference to FIG. 15A, RLIC memory 1220 can store rack-level liquid cooling control (RLLCC) firmware 1510, which is inclusive of the firmware that controls the rack-level liquid cooling of DL RHIS 1100. RLIC memory 1220 also stores desired exterior space temperatures 1512 for block 1150A-D. User input device 1197 (FIG. 11) can be used to set desired exterior space temperatures 1512 for each of the blocks 1150A-D.

In one embodiment, a default ambient temperature is preset for each block or for the rack, and that default is utilized in the exhaust air calculations until the value is modified by user input. In one embodiment, the default ambient temperature can be an actual temperature value. In another embodiment, the default ambient temperature can be programmed to be a percentage of the measured ambient temperature. For example, the desired ambient temperature can be preset to be 90% of the measured ambient temperature, to ensure the room remains cooled as heat continually escapes from the various heat generating devices operating within the room. As another example, the desired ambient temperature can be set to 120% of the measured ambient temperature of the room, where the RIHS is operating in a room or environment that exists at an average ambient temperature that is some percentage colder than desired.

FIG. 15B illustrates contents of BC-BLC memory 1320, which includes components utilized by BC 1152 and, where appropriate BLC 1190, during liquid cooling operations. It is appreciated that the illustrated BC-BLC memory 1320 can generally be described as the memory of BC 1152 as the firmware and data values are ones utilized during computations performed primarily by BC 1152. The presentation as a single memory is solely to simplify the description, as the same memory component may also store information utilized by BLC 1190. BC-BLC memory 1320 can store exhaust air cooling control (EACC) firmware 1550, which is inclusive of the firmware that regulates the exhaust air temperature for blocks 1150A-D of DL RHIS 1100. BC-BLC memory 1320 stores desired exterior space temperature 1552 for block 1150A that is received from RLIC 1178. Desired exterior space temperature 1552 is the desired temperature of air surrounding block chassis 810 (FIG. 8) during operation of DL RIHS 1100. BC-BLC memory 1320 also stores block power consumption 1554, current exterior space (ambient) temperature 1556, a calculated amount of heat exchange 1558, calculated block minimum flow rate 1560, and a current block flow rate 1562. Block power consumption 1554 is the amount of power consumed by the functional components operating within the interior space of block 1150A. In one embodiment, block power consumption 1554 can be monitored and generated by block controller 1152A. In another embodiment, block power consumption 1554 can be determined by block controller 1152A from a temperature reading by a temperature sensor, such as a thermistor, placed in proximity to or within the interior space.

Current exterior space temperature 1556 is received from exterior space temperature sensor 1196E. Amount of heat exchange 1558 is calculated by BC 1152 and is the amount of heat exchange required within each liquid-to-air heat exchange subsystem 1350 to moderate the current ambient temperature 1556 to the desired ambient temperature 1552. During cooling operations, the amount of heat exchange 1558 correlates to a temperature of exhaust air generated from the liquid-to-air heat exchange subsystem. Block minimum flow rate 1560 is calculated by BC 1152 and is the flow rate for liquid flowing through the conduits within block 1150A that is required to provide the amount of heat exchange in the liquid-to-air heat exchange subsystem 1350. Current block flow rate 1562 is the current flow rate of liquid flowing through the conduits within block 1150A, as measured by flow meter 1192. PID parameters 1564 contain constants 1620, 1622 and 1624 for block 1150A.

BC-BLC memory 1320 further contains a valve position 1566, exhaust air temperatures (temps) 1568, and fan speeds 1570. Valve position 1566 is the current open/closed position of valve 1194. Exhaust air temperature 1568 is the exhaust air temperature measured and received from exhaust air temperatures sensor 1196D. Fan speed 1570 is the current fan speed of fan modules 1352. BC memory 1320 also stores exhaust air cooling algorithm 1574 and PID parameters 1576. Exhaust air cooling algorithm 1574 is used by BC 1152 to calculate the cooling liquid flow rate for block 1150A. PID parameters 1576 are constants used in exhaust air cooling algorithm 1574. The PID parameters 1576 can be different for each of blocks 1150A-D and can be assigned separate values in BLC memory 1320. BC-BLC memory 1320 can also store return water temperature 1582, which is the temperature of the return water as measured by return liquid temperature sensor 1196C, and supply water temperature 1580, which is the temperature of the supply water, as measured by supply inlet water temperature sensor 1196B. Inlet air temperature 1584 is the temperature of intake air coming to ATLHE 1350.

Figure 16:
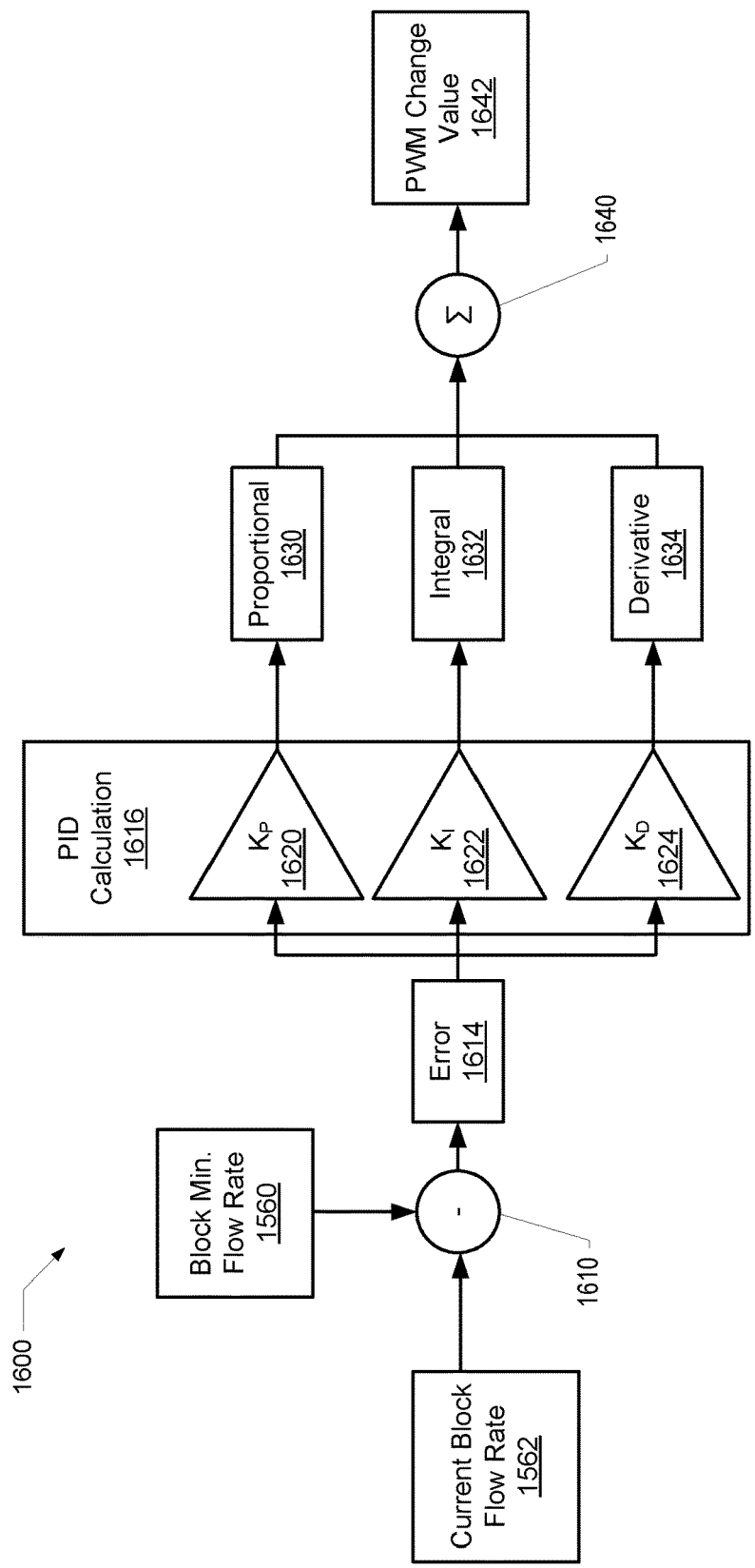
FIG. 16 is a block diagram illustrating a proportional integral and derivative (PID) control scheme utilized within liquid flow control in the RIFTS, in accordance with one embodiment.

FIG. 16A illustrates a PID control loop 1600 that is a part of exhaust air cooling algorithm 1574. In one embodiment, exhaust air cooling algorithm 1574 is used to at least partially determine the flow rate for liquid flowing through block 1150A in order to determine or control the amount of heat exchange occurring in the liquid-to-air heat exchange subsystem 1350. Exhaust air cooling algorithm 1574 uses PID control loop 1600 to determine the flow rate for block 1150A with the current block flow rate 1562 and the block minimum flow rate 1560 as inputs. In one embodiment, the block minimum flow rate 1560 is calculated by the following equation:

$$\text{Block minimum flow rate} = q_{total} \times 0.0038 / T \text{ water return} - T \text{ water supply} \tag{1}$$

where $q_{total}$ is the calculated total amount of heat required to be rejected to the liquid from the exhaust air in ATLHE 1350. T water return corresponds to return water temperature 1582 and T water supply corresponds to supply water temperature 1580. Additionally, $q_{total}$ is calculated by the following equation:

$$q_{total} = q_{air} + q_{servers} \quad (2)$$

where $q_{air}$ is the amount of heat to be absorbed by the cooling liquid from the air via ATLHE 1350 and qservers is the heat to be absorbed via liquid cooling of LC nodes 1154A-D. The qservers is equal to the sum of the power consumed by LC nodes 1154A-D. And, $q_{air}$ is calculated by the following equation:

$$q_{air} = Q_{air} \times (T_{inlet\ air} - T_{desired\ exterior\ air})/1.76 \quad (3)$$

where Qair is the total airflow through block 1150 as calculated from fan speed 1570, $T_{inlet\ air}$ corresponds to inlet air temperature 1584, and $T_{desired\ exterior\ air}$ corresponds to desired exterior space temperature 1552.

PID control loop 1600 is a control loop that continuously calculates an "error value" as the difference between a measured process variable and a desired set point. PID control loop 1600 determines a difference 1610 between the block minimum flow rate 1560 and the current block flow rate 1562 as measured by flow meter 1192.

The resulting error value 1614 is used in PID calculation 1616 along with proportional constant (Kp) 1620, integral constant (Ki) 1622, and derivative constant (Kd) 1624. PID parameters 1576 (FIG. 15B) contain constants 1620, 1622 and 1624 for blocks 1150A. The resulting proportional value 1630, integral value 1632, and derivative value 1634 are summed 1640 to generate a PWM change value 1642. PWM change value 1642 is transmitted to PWM circuit 1314 in order to generate a new PWM signal, which causes liquid control valve 1194 (FIG. 13) of the specific block to move to a new position corresponding to PWM change value 1642. Thus, each block receives an independent PWM change value that determines the flow rate of cooling liquid through that block based on the current conditions affecting that specific block, the inputted or default values, and the amount of cooling required across the nodes within that block.

According to one or more embodiments, the control of the liquid control valves 1194 of each block within DL RIHS also involves consideration of certain additional factors and determinations, which are described in co-related application. As a brief summary of those aspects, a rack flow algorithm, a block flow rate algorithm and an exhaust air cooling algorithm 1574 are all used by RLIC 1178 to control the overall liquid cooling and flow rates of DL RIHS 100. The exhaust air cooling algorithm 1574 calculates a cooling liquid flow rate required to effect an amount of heat exchange in LTAHE 1350 to moderate a detected ambient temperature to a desired ambient temperature, which correlates to and/or determines a temperature of exhaust air generated from LTAHE 1350. RLIC 1178 can control the overall liquid cooling of DL RIHS 100 based on a hierarchal level of priority assigned to each of the flow algorithms. The rack flow algorithm can dictate the maximum or 'upper flow limit' for each block. Requests for negative PWM changes (reduced flow rates) from rack flow algorithm indicate the block is at or above it maximum flow limit. Negative PWM changes from the rack flow algorithm are treated as the highest priority (priority 1 level) by RLIC 1178 and supersede the output from all other algorithms. Positive output from the rack flow algorithm are lower in priority (priority 4 level) and are followed by RLIC 1778 in the absence of a higher priority request from any other algorithms such as the block flow rate algorithm or the exhaust air cooling algorithm 1574 (which has a priority level of 2). The block flow rate algorithm dictates the flow rate based upon the hottest CPU temperature when the block is operating at less than the block maximum flow rate cap and above the block minimum flow rate. Requests for PWM changes by the block flow rate algorithm are treated as a priority 3 level by RLIC 1778.

Figure 17:
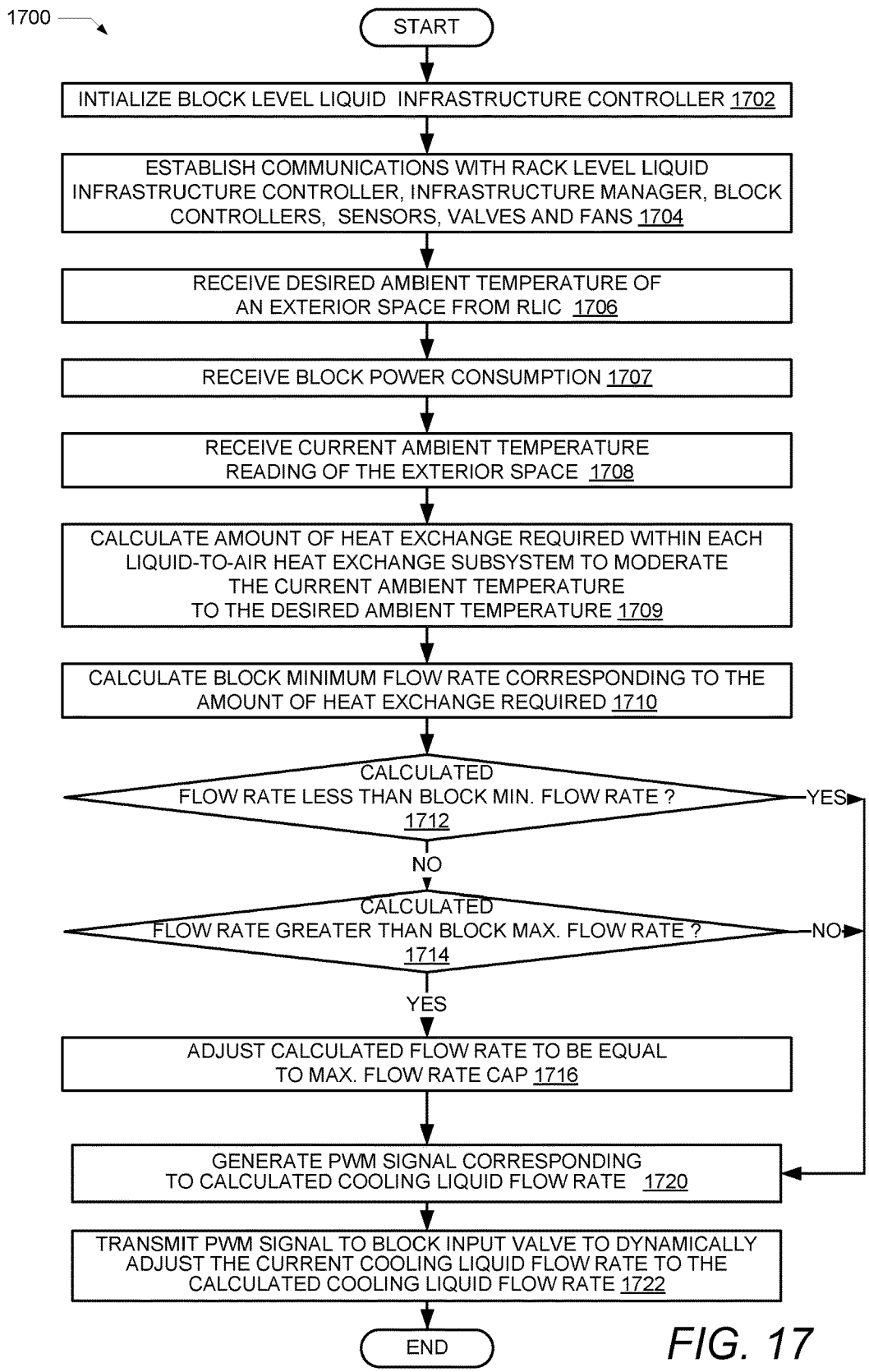
FIG. 17 is a flow chart illustrating one example of a method for regulating exhaust air temperature from a DL RIHS, according to one or more embodiments.

FIG. 17 illustrates a flowchart of an exemplary method 1700 by which BC 1152 within the preceding figures performs different aspects of the processes that enable the one or more embodiments of the disclosure. Specifically, method 1700 is described as being implemented via BC 1152 and particularly the execution of code provided by EACC firmware 1550 within BC 1152. It is however appreciated that certain aspects of the described methods may be implemented via other processing devices and/or execution of other code. Generally, method 1700 represents a computer-implemented method. The description of the method is provided with general reference to the specific components illustrated within the preceding FIGS. 1-16.

With specific reference to FIG. 17, the flow chart illustrates a computer-implemented method 1700 for regulating exhaust air temperature from block 1150A in DL RIHS 1100. It is appreciated that although the method processes are described herein only for block 1150A, these processes are performed for each block within DL RIHS 1000. Method 1700 begins at the start block and proceeds to block 1702 where BC 1152 is initialized. The initialization of BC 1152 includes BC 1152 loading EACC firmware 1550, loading PID parameters 1576, and loading exhaust air cooling algorithm 1574. At block 1704, BC 1152 establishes communications with RLIC 1178, IM 1130, and BLC 1190, which in turn communicates with valve 1194, sensors 1196A-E, flow meter 1192 and fan modules 1352.

BC 11520 receives an input of desired exterior (ambient) space temperature 1552 (block 1706). In one embodiment, a user input device 1197 can allow an IT manger or system administrator to input desired exterior space temperature 1552 and to modify that value as needed. However, if no desired exterior (ambient) space temperature 1552 is received, the desired exterior (ambient) space temperature 1552 can be set to a default value, such as to enable 100% heat rejection by ATLHE 1350. BC 1152 receives block power consumption 1554 (block 1707). BC 1152 receives current exterior (ambient) space temperature 1556 from exterior space temperature sensor 1196E (block 1708). In one embodiment, the exterior (ambient) space temperature 1556 is detected from the air at the air intake side (e.t., the cold aisle) of the RIHS, rather than from an exterior placed temperature sensor. It is appreciated that in an open air environment, the temperature of the intake air can approximate the ambient temperature of the room in which the RIHS is located. BC 1152 calculates an amount of heat exchange 1558 required within block 1150A for ATLHE 1350 to moderate the current exterior (ambient) space temperature 1556 to the desired ambient space temperature 1552 (block 1709) using the exhaust air from the ATLHE 1350. The calculation of the amount of heat exchange is based at least partially on the desired exterior (ambient) space temperature 1552, the current exterior (ambient) space temperature 1556, and the amount of airflow through the block. The amount of airflow through the block is determined by and correlates to the fan speed, which is a variable that can also be controlled by the block controller. According to one embodiment, the amount of heat exchange correlates to a temperature of exhaust air generated from ATLHE 1350. BC 1152 calculates a block minimum flow rate 1560 required for liquid flowing through block 1150A to enable the amount of heat exchange in the ATLHE 1350 (block 1710). ATLHE 1350 enables heat to be removed from the air within a block or from the air within chassis 810 by transferring heat from the air to the cooling liquid via liquid absorption. Because the air temperature is greater than the temperature of the cooling liquid, heat flows via ATLHE 1350 from the air to the liquid. Also, the rate of heat absorption is determined by the flow rate, where a higher liquid flow rate provides additional volume of liquid flowing over time, which higher volume is able to absorb additional amounts of heat from the exhaust air. Alternatively, a lower flow rate reduces the amount of liquid flow and consequently the amount of heat absorption that can occur, resulting in more heat remaining in the exhaust air, which can potentially cause an increase in the ambient temperature.

BC 1152 compares the calculated flow rate to block minimum flow rate 1560 and determines (at block 1712) if the calculated flow rate is less than block minimum flow rate 1560. In response to the calculated flow rate being less than block minimum flow rate 1560, BC 1190 generates PWM signals corresponding to the block minimum flow rate 1560 via PWM circuit 1314 (block 1720) and triggers the valve 1194 to move to a position corresponding to the block minimum flow rate 1560 such that sufficient cooling liquid is provided to components of block 1150A (block 1722). BC 1152 also compares the calculated flow rate to a maximum flow rate cap for the block and determines (at block 1714) if the calculated flow rate is above the maximum flow rate cap. If the calculated flow rate is above the maximum flow rate cap, BC 1152 adjusts the calculated flow rate to be equal to the maximum flow rate cap (block 1716). After block 1716 and in response to the calculated flow rate being above the block minimum flow rate 1560 and at or below the maximum flow rate cap, BC 1152 generates PWM signals corresponding to the calculated flow rate via PWM circuit 1314 (block 1720) and triggers the liquid control valve 1194 to move to a position corresponding to the calculated flow rate (block 1722). The flow rate of the liquid flowing through the block 1150A including LC nodes 1154A-D and ATLHE 1350 is thus dynamically adjusted to the calculated flow rate and the exhaust air is exhausted at a specific temperature (or temperature range) that allows the ambient air temperature to approach the desired ambient air temperature as the exhaust air mixes with the ambient air. Method 1700 then ends.

In one embodiment, a user can modify the ambient temperature within one or more of block chassis 810 (FIG. 8) and rack 104 (FIG. 1) by inputting a desired exterior space temperature 1552 causing ATLHEs 1350 to modify the temperature of the exterior space based on the exhaust air temperature 1568 relative to the current ambient exterior space temperature 1552.

In the above described flow chart of FIG. 17, one or more processes within the method may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method comprising:
receiving a first input corresponding to a desired ambient temperature of an exterior space outside of and surrounding a direct-injection, liquid-cooled (DL) rack information handling system (RIHS), wherein the RIHS comprises at least one liquid cooled (LC) node within a block chassis and a corresponding air-to-liquid heat exchange (ATLHE) subsystem through which air passing through the LC node is channeled as exhaust air towards the exterior space;

receiving a second input corresponding to an amount of heat being dissipated from functional components operating within an interior space of the at least one LC node;

receiving a current ambient temperature reading of the exterior space;

calculating a flow rate for liquid flowing through the ATLHE subsystem that results in an amount of heat exchange in the ATLHE subsystem, which generates exhaust air at a temperature that causes a change in the ambient temperature towards the desired ambient temperature outside of the DL RIHS; and dynamically adjusting the flow rate of the liquid flowing through the ATLHE subsystem to the calculated flow rate.

2. The method of claim 1, wherein:

the ATLHE subsystem includes at least one block liquid controller and a corresponding liquid control valve that controls the flow rate of the liquid flowing through the ATLHE subsystem based on a value of a pulse width modulated (PWM) signal calculated by the at least one block liquid controller and transmitted to the corresponding liquid control valve; and dynamically adjusting the flow rate of the liquid flowing through the ATLHE subsystem to the calculated flow rate further comprises:

generating a corresponding PWM signal that is proportional to the calculated flow rate; and transmitting the corresponding PWM signal to the liquid control valve such that the liquid control valve moves to an open position that results in cooling liquid flow at the calculated liquid flow rate.

3. The method of claim 2, further comprising:

determining whether the calculated flow rate is less than a block minimum flow rate;

in response to the calculated flow rate being less than block minimum flow rate, generating a PWM signal corresponding to the block minimum flow rate, and triggering the liquid control valve to move to a position corresponding to the block minimum flow rate;

determining whether the calculated flow rate is above a maximum flow rate cap;

in response to the calculated flow rate being above the maximum flow rate cap, adjusting the calculated flow rate to be equal to the maximum flow rate cap, and triggering the liquid control valve to move to a position corresponding to the maximum flow rate cap; and in response to the calculated flow rate being above the block minimum flow rate and at or below the maximum flow rate cap, triggering the liquid control valve to move to a position corresponding to the calculated flow rate.

4. The method of claim 1, wherein the second input comprises at least one of:

an amount of power consumed by each of the functional components operating within the interior space of the at least one LC node; and a temperature reading by a temperature reading component placed in proximity to or within the interior space.

5. The method of claim 1, wherein:

calculating the flow rate for liquid flowing through the LC subsystem further comprises:

calculating an amount of heat absorption required by the cooling liquid within the ATLHE subsystem to provide the exhaust air at a temperature that causes a change in the ambient temperature to the desired ambient temperature; and calculating the amount of heat absorption further comprises;

determining a total amount of heat to be removed from the at least one LC node;

receiving a first temperature value of an incoming liquid to the ATLHE subsystem and a second temperature value of an outgoing liquid from the ATLHE subsystem; and calculating the flow rate for liquid flowing through the ATLHE subsystem in part based on the first amount of heat to be removed from the at least one LC node and the incoming and outgoing liquid temperatures.

6. The method of claim 5, wherein determining the total amount of heat to be removed from the at least one LC node further comprises:

determining a first amount of heat to be removed from processing components within the at least one LC node:

determining a second amount of heat to be removed from a plurality of other components within the at least one LC node; and adding the first amount and second amount of heat to determine the total amount of heat, wherein the total amount of heat to be removed from the at least one LC node is the sum of the first and second amounts of heat.

7. The method of claim 1, wherein calculating the flow rate for liquid flowing through the ATLHE subsystem further comprises:

retrieving control parameters associated with the block containing the at least one LC node, the control parameters comprising proportional, integral and derivative (PID) algorithm data;

determining a first difference between the calculated flow rate and a current flow rate;

calculating a pulse width modulated (PWM) signal change value using a PID algorithm based on the first difference and the control parameters; and forwarding the PWM signal change value to the liquid control valve that controls the flow rate of the liquid flowing through the ATLHE subsystem based on a value of the PWM signal received at each of the at least one liquid control valves.

8. A liquid cooling system for a direct injection liquid cooled (DL) rack information handling system (RIHS) comprising:

a rack having at least one liquid cooled (LC) node within a block chassis;

a liquid cooling subsystem associated with the rack, the liquid cooling subsystem including:

at least one air-to-liquid heat exchange ATLHE subsystem that receives intake air at a first temperature and provides exhaust air at a second temperature based on a heat exchange gradient between cooling liquid flowing through the ATLHE subsystem and the ambient temperature of air being passed through the ATLHE subsystem;

a network of conduits that enables cooling liquid to flow through the at least one LC node and through the ATLHE subsystem, the network of conduits including an intake conduit that enables cooling fluid to be passed through the at least one LC node; and at least one liquid control valve in fluid communication with, and controlling a rate of flow of cooling liquid through, corresponding fluid intake ports of the network of conduits;

a controller associated with the at least one LC node and communicatively coupled to the at least one liquid control valve and to at least one temperature measuring device; and wherein the controller has firmware executing thereon that configures the controller to:

receive a first input corresponding to a desired ambient temperature of an exterior space outside of and surrounding the DL RIES;

receive a second input corresponding to an amount of heat being dissipated from functional components operating within an interior space of the at least one LC node;

receive a current ambient temperature reading of the exterior space;

calculate a flow rate for liquid flowing through the ATLHE subsystem that results in an amount of heat exchange in the ATLHE subsystem, which generates exhaust air at a temperature that causes a change in the ambient temperature towards the desired ambient temperature outside of the DL RIES; and dynamically adjust the flow rate of the liquid flowing through the ATLHE subsystem to the calculated flow rate.

9. The liquid cooling system of claim 8, wherein the liquid control valve controls the flow rate of the liquid flowing through the ATLHE subsystem based on a value of a pulse width modulated (PWM) signal calculated by the controller and transmitted to the corresponding liquid control valve and wherein dynamically adjusting the flow rate of the liquid flowing through the ATLHE subsystem to the calculated flow rate further comprises the firmware further configuring the controller to:

generate a corresponding PWM signal that is proportional to the calculated flow rate; and transmit the corresponding PWM signal to the liquid control valve such that the liquid control valve moves to an open position that results in cooling liquid flow at the calculated liquid flow rate.

10. The liquid cooling system of claim 9, further comprising:

determining whether the calculated flow rate is less than a block minimum flow rate;

in response to the calculated flow rate being less than block minimum flow rate, generating a PWM signal corresponding to the block minimum flow rate, and triggering the liquid control valve to move to a position corresponding to the block minimum flow rate;

determining whether the calculated flow rate is above a maximum flow rate cap;

in response to the calculated flow rate being above the maximum flow rate cap, adjusting the calculated flow rate to be equal to the maximum flow rate cap, and triggering the liquid control valve to move to a position corresponding to the maximum flow rate cap; and in response to the calculated flow rate being above the block minimum flow rate and at or below the maximum flow rate cap, triggering the liquid control valve to move to a position corresponding to the calculated flow rate.

11. The liquid cooling system of claim 8, wherein the second input comprises at least one of:

an amount of power consumed by each of the functional components operating within the interior space of the at least one LC node; and a temperature reading by a temperature reading component placed in proximity to or within the interior space.

12. The liquid cooling system of claim 8, wherein calculating the flow rate for liquid flowing through the ATLHE subsystem comprises the firmware further configuring the controller to:

calculating an amount of heat absorption required by the cooling liquid within the ATLHE subsystem to provide the exhaust air at a temperature that causes a change in the ambient temperature to the desired ambient temperature; and calculating the amount of heat absorption further comprises:

determining a total amount of heat to be removed from the at least one LC node;

receiving a first temperature value of an incoming liquid to the ATLHE subsystem and a second temperature value of an outgoing liquid from the ATLHE subsystem; and calculating the flow rate for liquid flowing through the ATLHE subsystem in part based on the first amount of heat to be removed from the at least one LC node and the incoming and outgoing liquid temperatures.

13. The liquid cooling system of claim 12, wherein determining the total amount of heat to be removed from the at least one LC node comprises the firmware further configuring the controller to:

determine a second amount of heat to be removed from a plurality of other components within the at least one LC node; and adding the first amount and second amount of heat to determine the total amount of heat, wherein the total amount of heat to be removed from the at least one LC node is the sum of the first and second amounts of heat.

14. The liquid cooling system of claim 8, wherein calculating the flow rate for liquid flowing through the ATLHE subsystem comprises the firmware further configuring the controller to:

retrieve control parameters associated with the block containing the at least one LC node, the control parameters comprising proportional, integral and derivative (PID) algorithm data;

determine a first difference between the calculated flow rate and a current flow rate;

calculate a pulse width modulated (PWM) signal change value using a PID algorithm based on the first difference and the control parameters; and forward the PWM signal change value to the liquid control valve that controls the flow rate of the liquid flowing through the ATLHE subsystem based on a value of the PWM signal received at each of the at least one liquid control valves.

15. A direct interface liquid-cooled (DC) rack information handling system (RIHS) comprising:

a rack having at least one liquid cooled (LC) node within a block chassis;

a liquid cooling subsystem associated with the rack, the liquid cooling subsystem including:

at least one air-to-liquid heat exchange (ATLHE) subsystem that receives intake air at a first temperature and provides exhaust air at a second temperature based on a heat exchange gradient between cooling liquid flowing through the ATLHE subsystem and the ambient temperature of air being passed through the ATLHE subsystem;
a network of conduits that enables cooling liquid to flow through the at least one LC node and through the ATLHE subsystem, the network of conduits including an intake conduit that enables cooling fluid to be passed through the at least one LC node; and
at least one liquid control valve in fluid communication with, and controlling a rate of flow of cooling liquid through, corresponding fluid intake ports of the network of conduits;
a controller associated with the at least one LC node and communicatively coupled to the at least one liquid control valve and to at least one temperature measuring device; and
wherein the controller has firmware executing thereon that configures the controller to:
receive a first input corresponding to a desired ambient temperature of an exterior space outside of and surrounding the DL RIHS;
receive a second input corresponding to an amount of heat being dissipated from functional components operating within an interior space of the at least one LC node;
receive a current ambient temperature reading of the exterior space;
calculate a flow rate for liquid flowing through the ATLHE subsystem that results in an amount of heat exchange in the ATLHE subsystem, which generates exhaust air at a temperature that causes a change in the ambient temperature towards the desired ambient temperature outside of the DL RIHS; and
dynamically adjust the flow rate of the liquid flowing through the ATLHE subsystem to the calculated flow rate.

16. The liquid cooled rack information handling system of claim 15, wherein the liquid control valve controls the flow rate of the liquid flowing through the ATLHE subsystem based on a value of a pulse width modulated (PWM) signal calculated by the controller and transmitted to the corresponding liquid control valve and wherein dynamically adjusting the flow rate of the liquid flowing through the ATLHE subsystem to the calculated flow rate further comprises the firmware further configuring the controller to:
generate a corresponding PWM signal that is proportional to the calculated flow rate; and
transmit the corresponding PWM signal to the liquid control valve such that the liquid control valve moves to an open position that results in cooling liquid flow at the calculated liquid flow rate.

17. The liquid cooled rack information handling system of claim 16, further comprising:
determining whether the calculated flow rate is less than a block minimum flow rate;
in response to the calculated flow rate being less than block minimum flow rate, generating a PWM signal corresponding to the block minimum flow rate, and triggering the liquid control valve to move to a position corresponding to the block minimum flow rate;
determining whether the calculated flow rate is above a maximum flow rate cap;
in response to the calculated flow rate being above the maximum flow rate cap, adjusting the calculated flow rate to be equal to the maximum flow rate cap, and triggering the liquid control valve to move to a position corresponding to the maximum flow rate cap; and
in response to the calculated flow rate being above the block minimum flow rate and at or below the maximum flow rate cap, triggering the liquid control valve to move to a position corresponding to the calculated flow rate.

18. The liquid cooled rack information handling system of claim 15, wherein the second input comprises at least one of:
an amount of power consumed by each of the functional components operating within the interior space of the at least one LC node; and
a temperature reading by a temperature reading component placed in proximity to or within the interior space.

19. The liquid cooled rack information handling system of claim 14, wherein calculating the flow rate for liquid flowing through the ATLHE subsystem comprises the firmware further configuring the controller to:
calculating an amount of heat absorption required by the cooling liquid within the ATLHE subsystem to provide the exhaust air at a temperature that causes a change in the ambient temperature to the desired ambient temperature; and
calculating the amount of heat absorption further comprises;
determining a total amount of heat to be removed from the at least one LC node;
receiving a first temperature value of an incoming liquid to the ATLHE subsystem and a second temperature value of an outgoing liquid from the ATLHE subsystem; and
calculating the flow rate for liquid flowing through the ATLHE subsystem in part based on the first amount of heat to be removed from the at least one LC node and the incoming and outgoing liquid temperatures.

20. The liquid cooled rack information handling system of claim 19, wherein determining the total amount of heat to be removed from the at least one LC node comprises the firmware further configuring the controller to:
determine a second amount of heat to be removed from a plurality of other components within the at least one LC node; and
adding the first amount and second amount of heat to determine the total amount of heat, wherein the total amount of heat to be removed from the at least one LC node is the sum of the first and second amounts of heat.

* * * * *